(12) United States Patent
Rindt et al.

(10) Patent No.: US 9,409,811 B2
(45) Date of Patent: Aug. 9, 2016

(54) OPTICAL CONVERTER SYSTEM FOR (W)LEDS

(75) Inventors: Matthias Rindt, Landshut (DE); Edgar Pawlowski, Stadecken-Elsheim (DE); Thomas Zetterer, Landshut, DE (US); Robert Hettler, Kumhausen (DE)

(73) Assignee: SCHOTT AG, Mainz (DE)

( * ) Notice: Subject to any disclaimer, the term of this patent is extended or adjusted under 35 U.S.C. 154(b) by 1358 days.

(21) Appl. No.: 12/990,385

(22) PCT Filed: Apr. 29, 2009

(86) PCT No.: PCT/EP2009/003108
§ 371 (c)(1),
(2), (4) Date: May 6, 2011

(87) PCT Pub. No.: WO2009/132837
PCT Pub. Date: Nov. 5, 2009

(65) Prior Publication Data
US 2011/0205740 A1 Aug. 25, 2011

(30) Foreign Application Priority Data
Apr. 29, 2008 (DE) .................. 10 2008 021 436

(51) Int. Cl.
*C03B 23/00* (2006.01)
*C03B 11/08* (2006.01)
(Continued)

(52) U.S. Cl.
CPC ............. *C03B 23/00* (2013.01); *C03B 11/08* (2013.01); *C03B 11/082* (2013.01);
(Continued)

(58) Field of Classification Search
CPC ...... C03B 23/00; C03B 11/08; C03B 19/101; C03B 11/082; C03B 2215/80; H01L 33/58; H01L 33/502; H01L 11/082; H01L 2924/0002; H01L 33/507
USPC ............. 362/84, 235, 157, 191, 217.14, 221, 362/225, 231, 293, 296.01, 296.04, 362, 362/363, 373, 551, 555; 315/210, 224, 113, 315/186, 201, 297, 294, 151, 192, 250, 291, 315/307, 152, 153, 185 R, 200 R, 206, 223, 315/254, 287, 121, 239, 292, 301, 76, 85; 257/98, E33.011, E33.055, E33.061, 257/13, 40, 79, 88, 89, 9; 323/282, 234, 323/285, 288, 311, 318, 320, 349; 345/76, 345/211, 212, 214, 690, 691
See application file for complete search history.

(56) References Cited

U.S. PATENT DOCUMENTS 7,074,345 B2 * 7/2006 Saito et al. ................ 252/301.36
7,078,732 B1 * 7/2006 Reeh et al. ....................... 257/98
(Continued)

FOREIGN PATENT DOCUMENTS

DE 19638667 2/1998
DE 102005031523 A1 1/2007
(Continued)

OTHER PUBLICATIONS

English translation of International Preliminary Report on Patentability dated Feb. 17, 2011 corresponding to International Patent Application No. PCT/EP2009/003108.
(Continued)

*Primary Examiner* — Stephen F Husar
*Assistant Examiner* — Danielle Allen
(74) *Attorney, Agent, or Firm* — Ohlandt, Greeley, Ruggiero & Perle, LLP

(57) ABSTRACT

The invention relates to an optical converter system for LEDs, preferably for so-called (W)LEDs, and a method for producing the named optical converter system. The modular-type optical converter system comprises an inorganic converter for converting the radiation emitted from the LED, an inorganic optical component, preferably comprising glass, which is disposed downstream relative to the converter in the direction of emission of the LED, wherein the converter and the first optical component are adjacent to one another and joined at least in sections. The optical converter system possesses a temperature resistance, which lies above that of the system known in the prior art. Also, the preferred components of the system are substantially resistant to UV and to chemicals.

20 Claims, 17 Drawing Sheets

(51) Int. Cl.
    *C03B 19/10*     (2006.01)
    *H01L 33/50*     (2010.01)
    *H01L 33/58*     (2010.01)

(52) U.S. Cl.
    CPC ........... *C03B 19/101* (2013.01); *H01L 33/502* (2013.01); *H01L 33/58* (2013.01); *C03B 2215/80* (2013.01); *H01L 33/507* (2013.01); *H01L 2924/0002* (2013.01)

(56) References Cited

U.S. PATENT DOCUMENTS

| | | |
|---|---|---|
| 2004/0190304 A1 | 9/2004 | Sugimoto et al. |
| 2007/0012887 A1 | 1/2007 | Letz et al. |

FOREIGN PATENT DOCUMENTS

| | | |
|---|---|---|
| DE | 202007014397 | 1/2008 |
| EP | 1418628 A1 | 5/2004 |
| JP | 2007013148 | 1/2007 |
| JP | 2007036200 | 2/2007 |
| JP | 2007088060 A | 4/2007 |
| JP | 2007134656 A | 5/2007 |
| JP | 2007-035951 A | 8/2007 |
| JP | 2007300043 A | 11/2007 |
| WO | 2006087660 A1 | 8/2006 |

OTHER PUBLICATIONS

First Office Action dated Mar. 21, 2012 corresponding to Chinese Patent Application No. 200980115405.7.
Office Action dated Jun. 10, 2013 from corresponding to German Patent Application No. 10 2008 021 436.1 with English translation, 10 pp.
Notification of Reason for Rejection dated Oct. 2, 2012 from corresponding Japanese Patent Application No. 2011-506606 with English translation, 7 pages.
International Search Report corresponding to International application No. PCT/EP2009/003108 dated Oct. 23, 2009.
Office Action dated Sep. 19, 2012 corresponding to Korean Patent Application No. 10-2010-7026451 with English translation.
English translation of Japanese Office Action dated Oct. 1, 2013 corresponding to Japanese Patent App. No. 2011-506606, 3 pp.
Japanese Decision of Rejection dated May 27, 2014 corresponding to Japanese Patent Application No. 2011-506606 with English translation, 3 pages.
Japanese Office Action dated Oct. 1, 2013 corresponding to Japanese Patent App. No. 2011-506606 with English translation.
European Patent Office Office Action dated Sep. 25, 2014 corresponding to European Patent Application No. 09 737 881.4 with English translation, 20 pages.
Written Opinion of the International Searching Authority dated Oct. 23, 2009 for corresponding International Application No. PCT/EP2009/003108, 7 pages.

\* cited by examiner

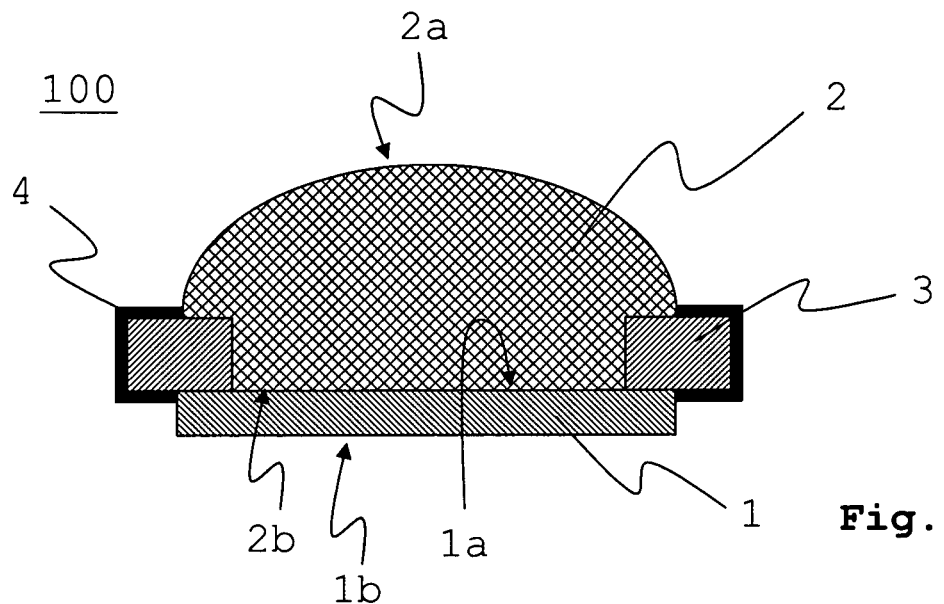
Fig. 1.a
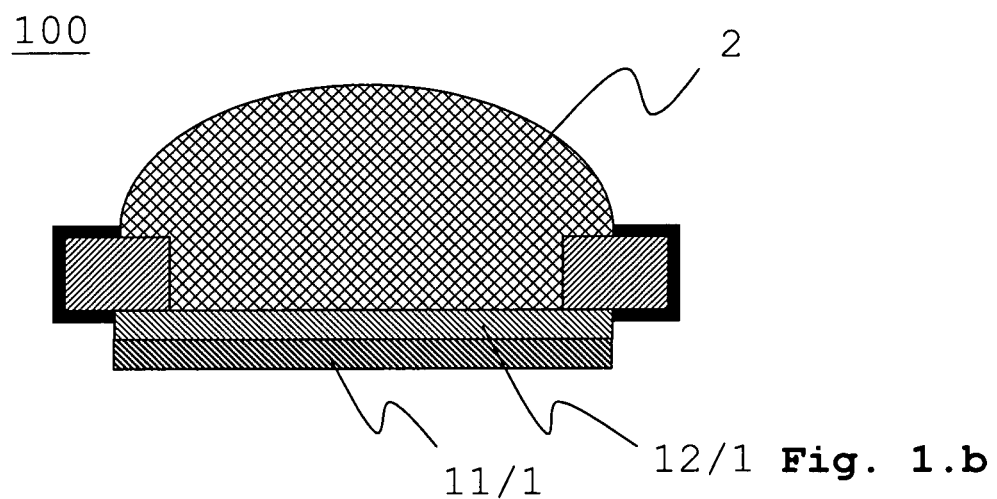
Fig. 1.b
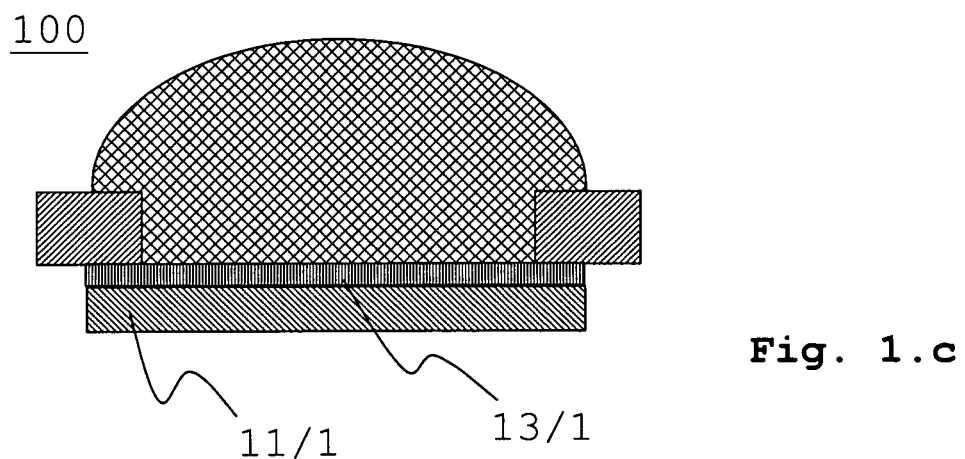
Fig. 1.c

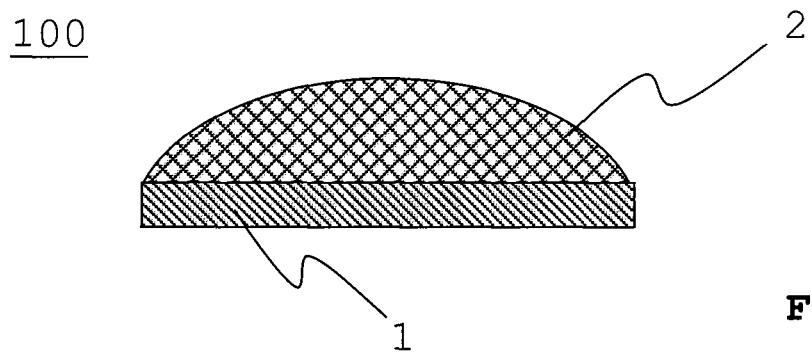
Fig. 1.d
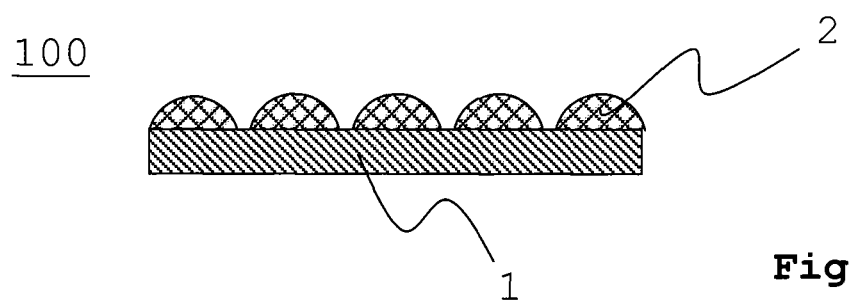
Fig. 1.e
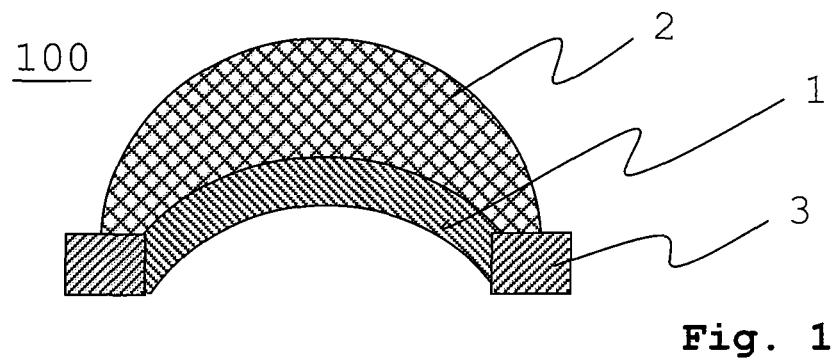
Fig. 1.f
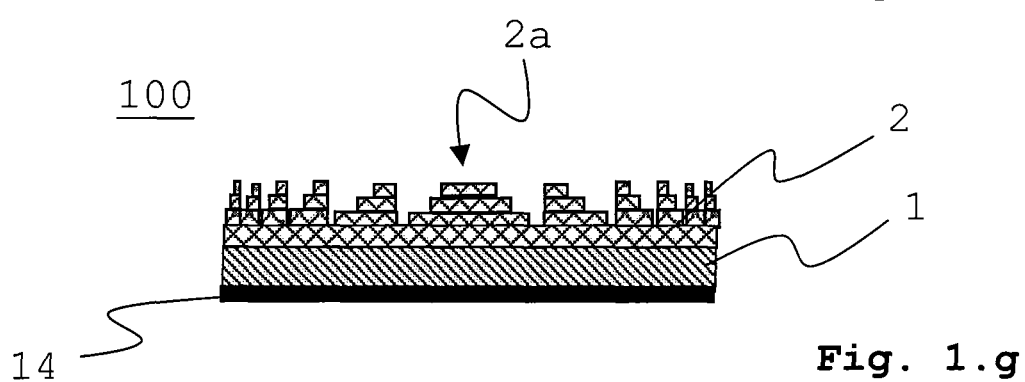
Fig. 1.g

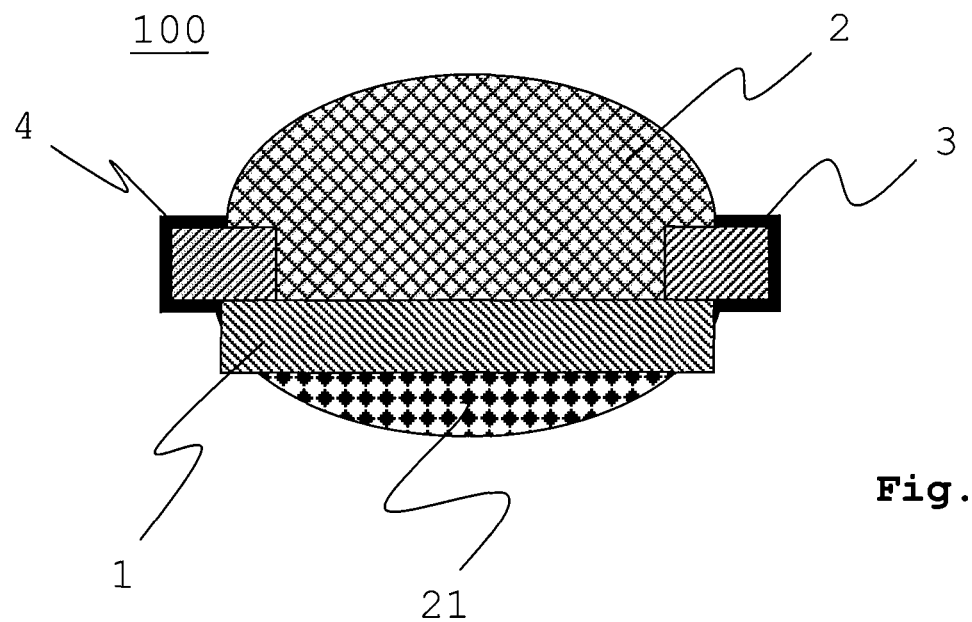
Fig. 1.h
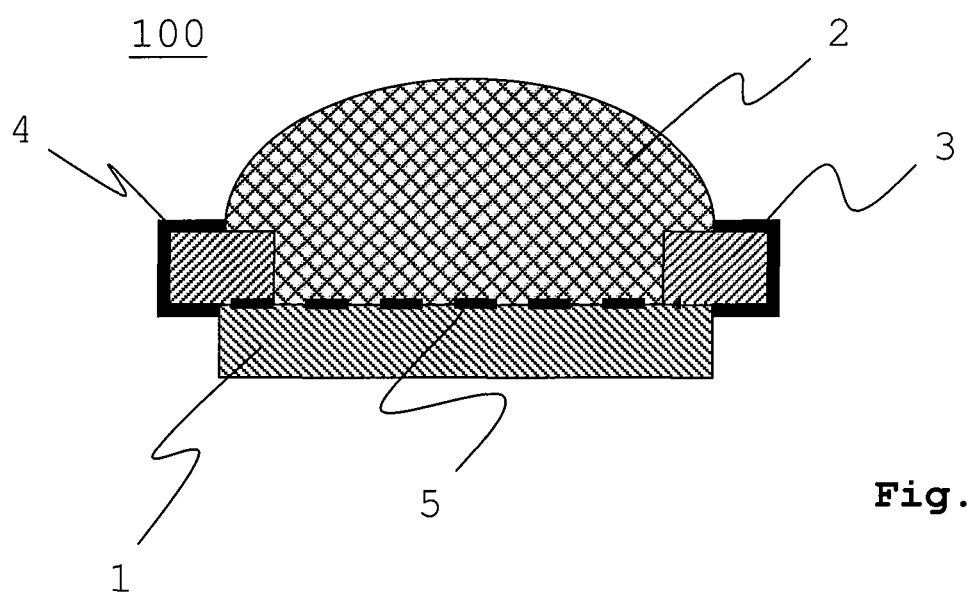
Fig. 1.i

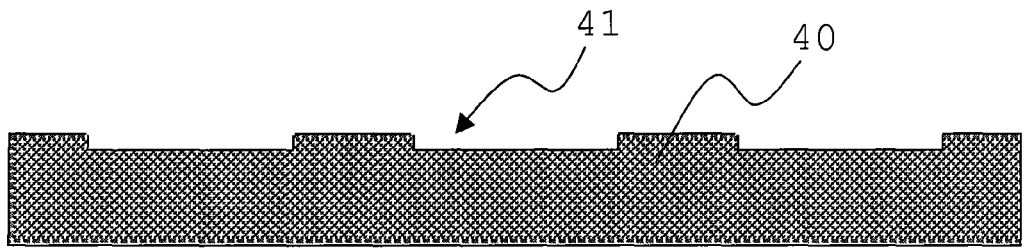
Fig. 2.a
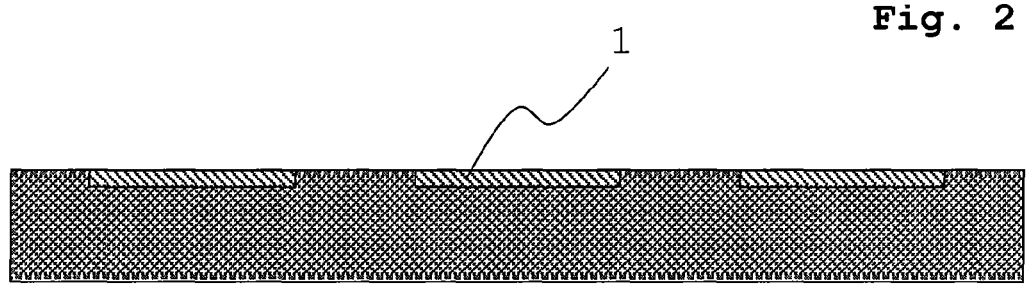
Fig. 2.b
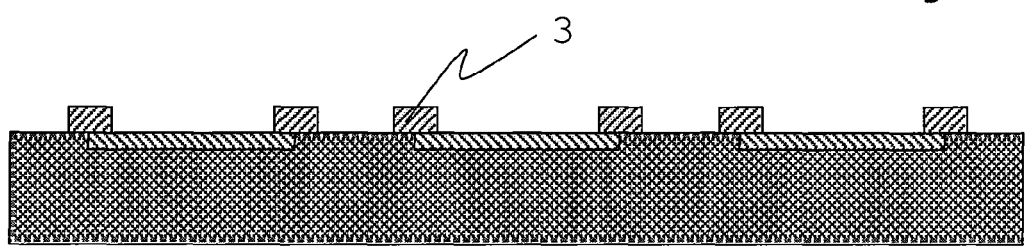
Fig. 2.c
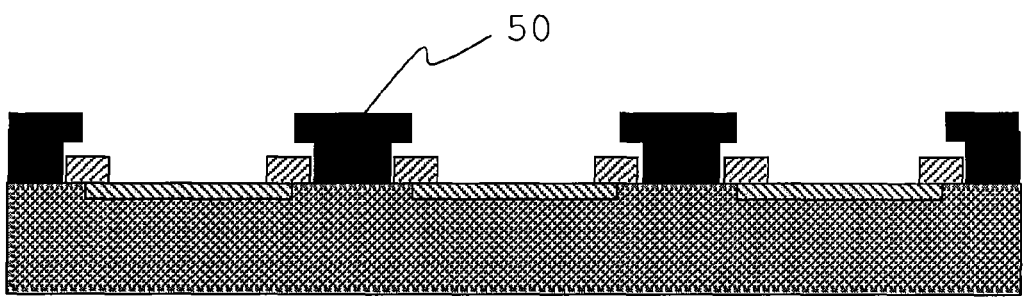
Fig. 2.d

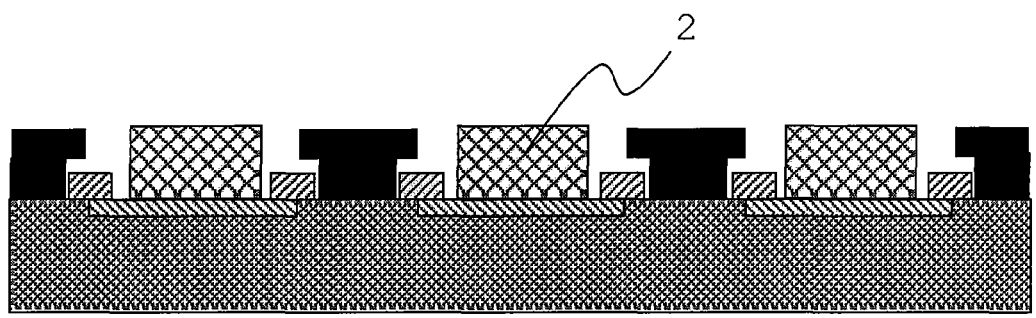
Fig. 2.e
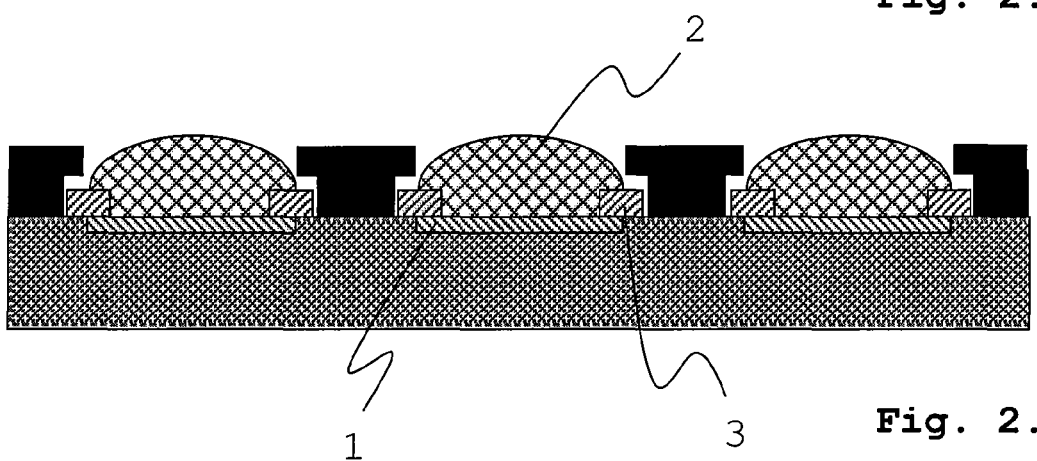
Fig. 2.f

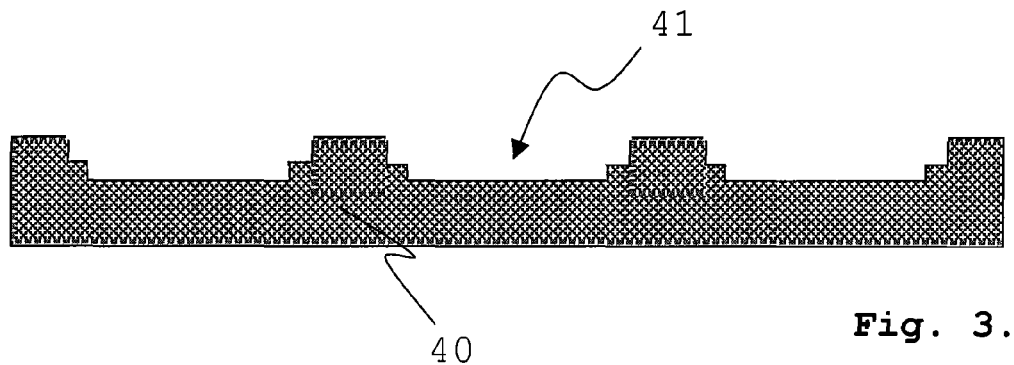
Fig. 3.a
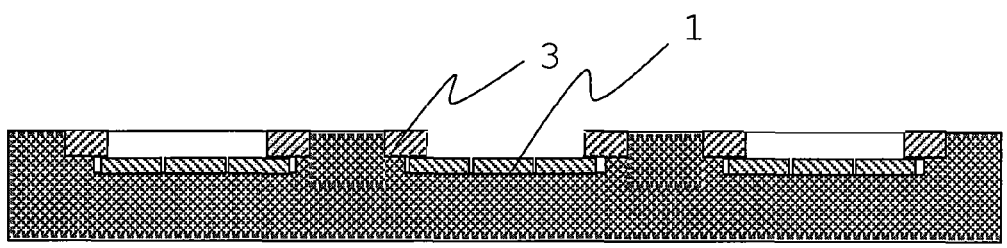
Fig. 3.b
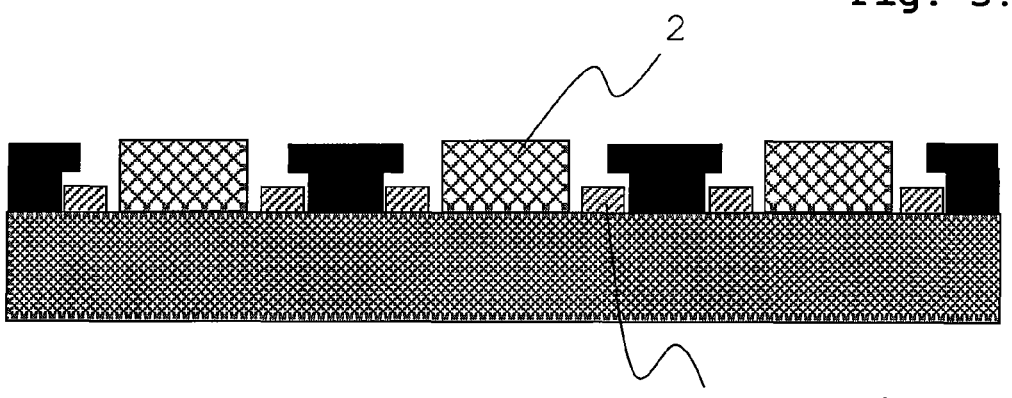
Fig. 3.c
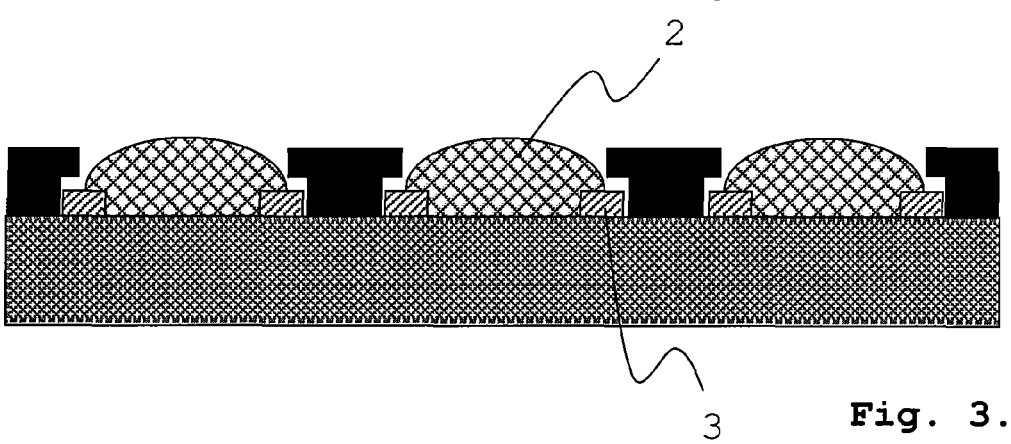
Fig. 3.d

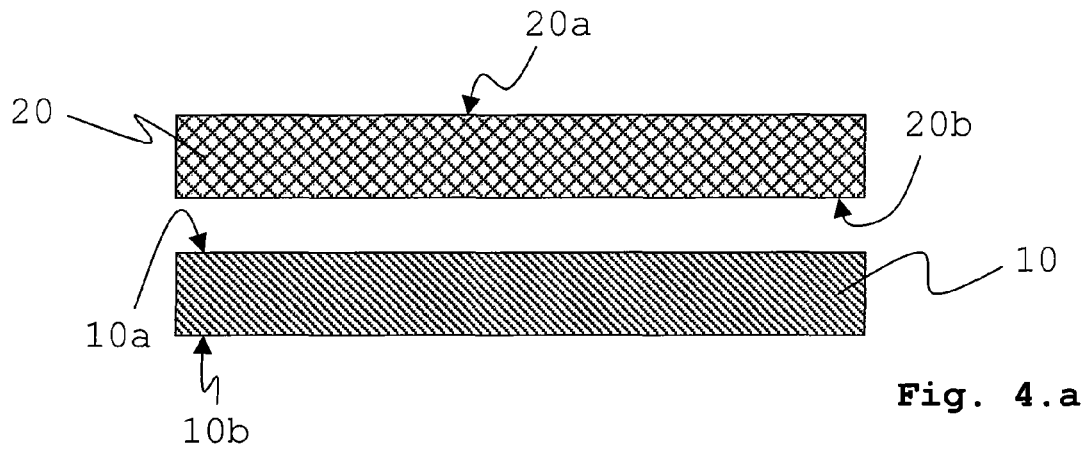
Fig. 4.a
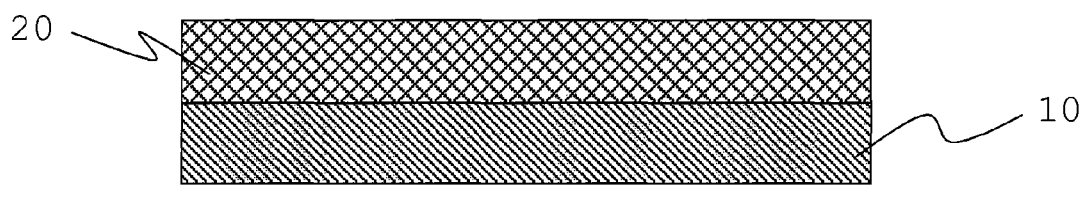
Fig. 4.b
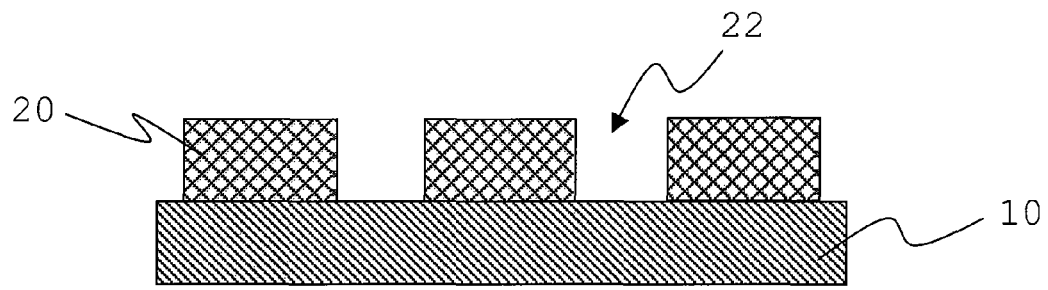
Fig. 4.c
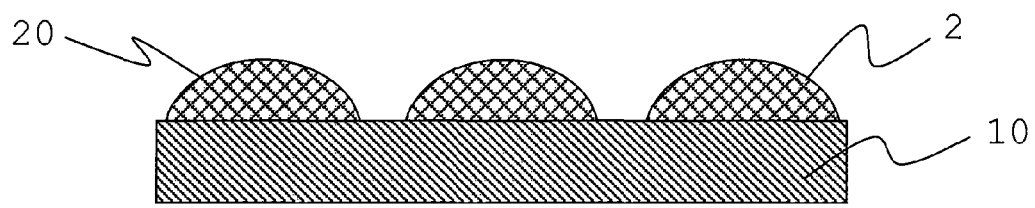
Fig. 4.d

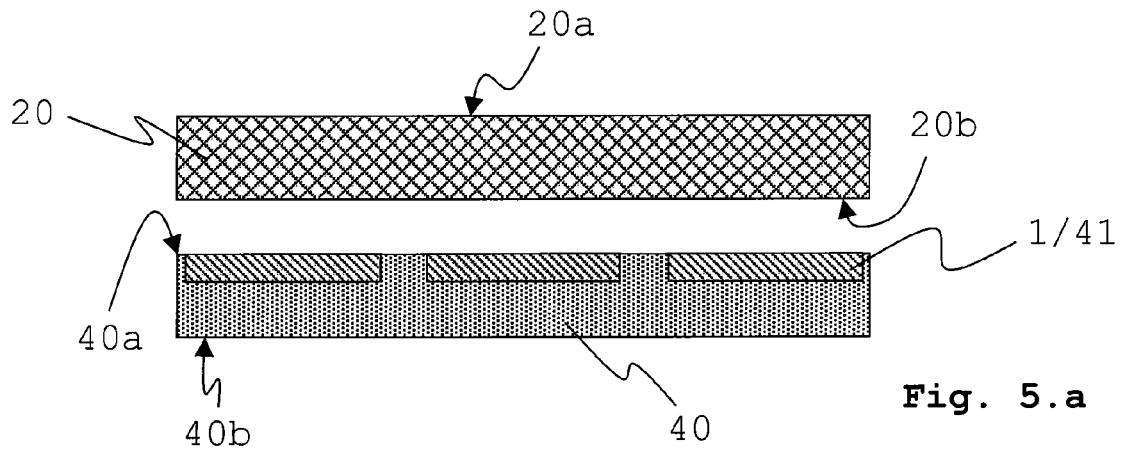
Fig. 5.a
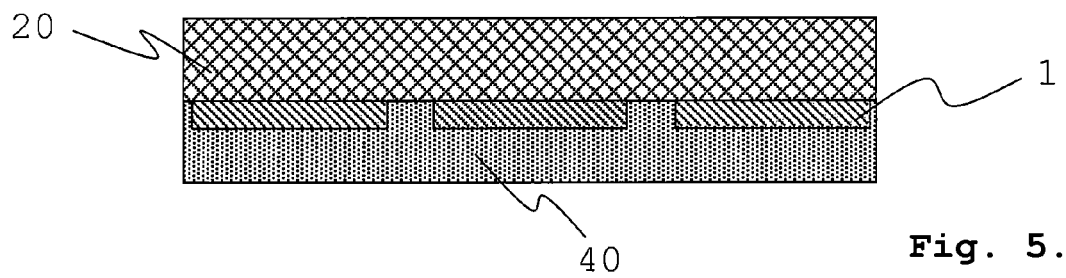
Fig. 5.b
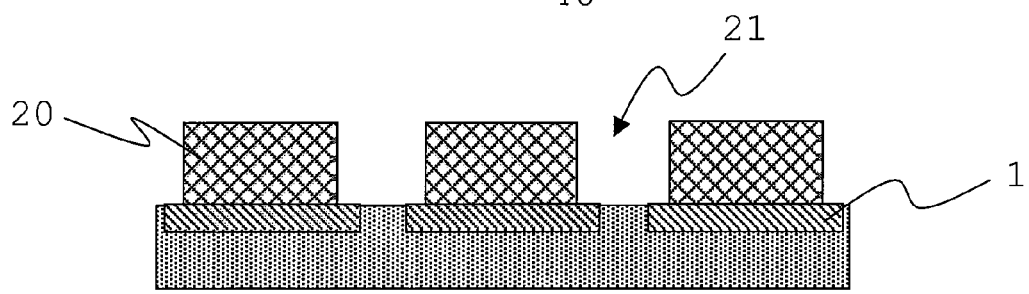
Fig. 5.c
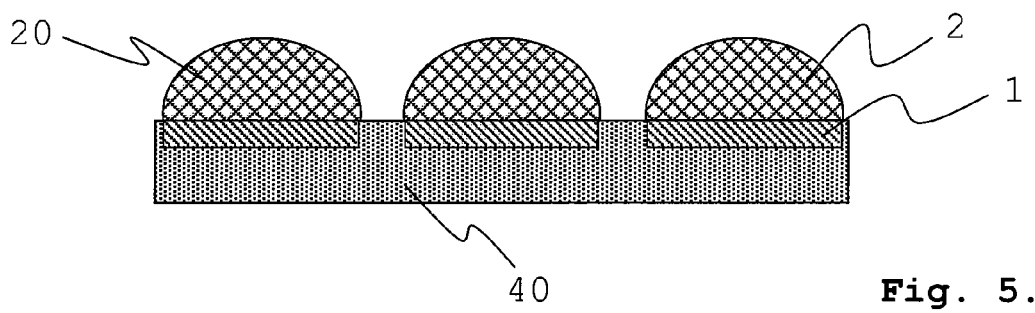
Fig. 5.d

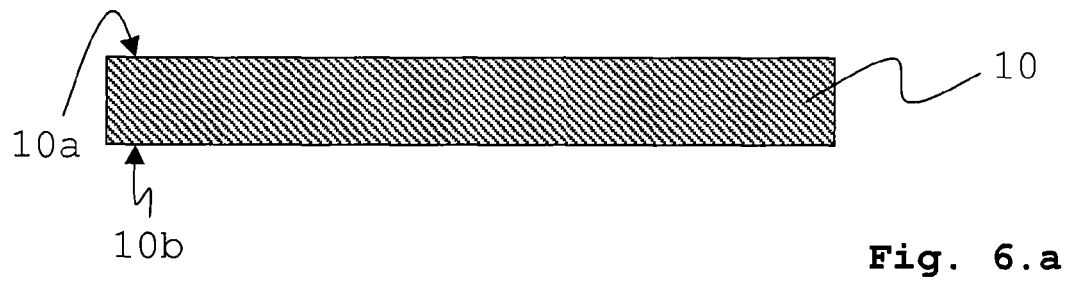
Fig. 6.a
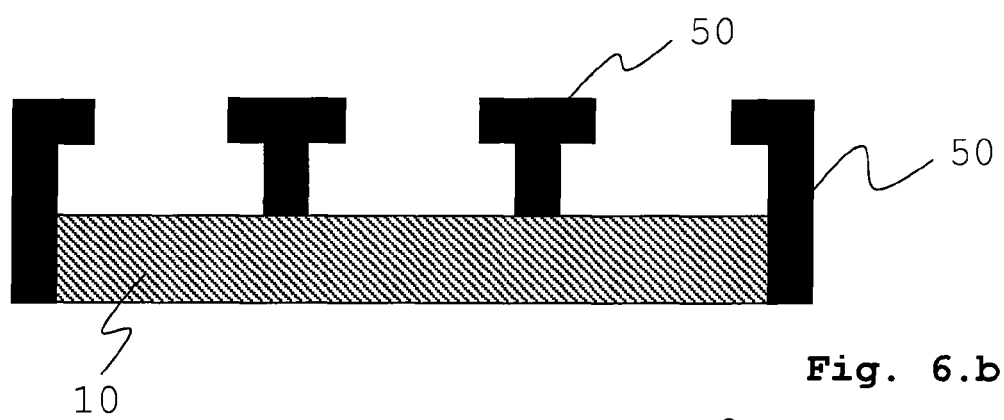
Fig. 6.b
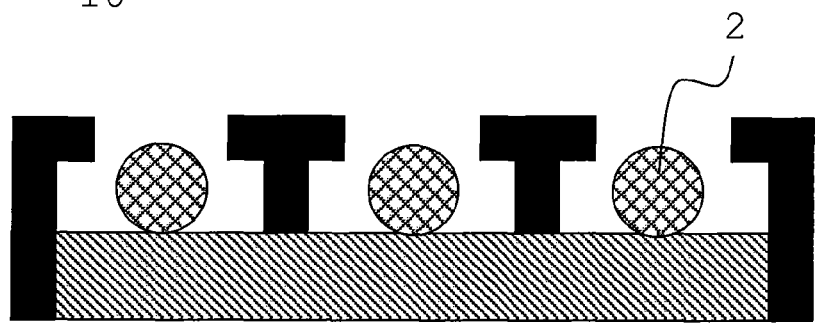
Fig. 6.c
Fig. 6.d

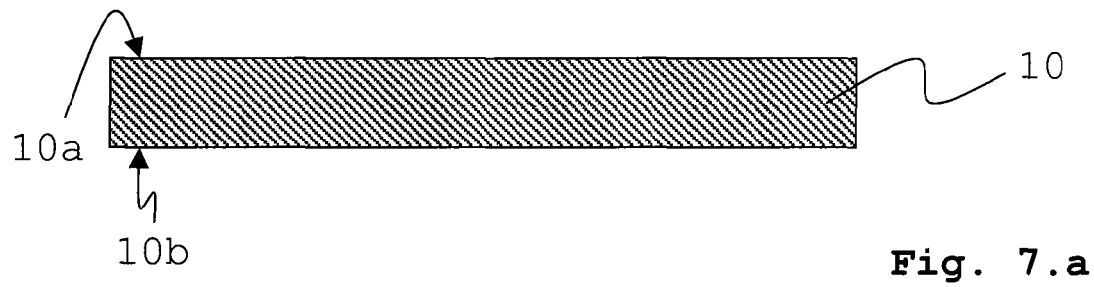
Fig. 7.a
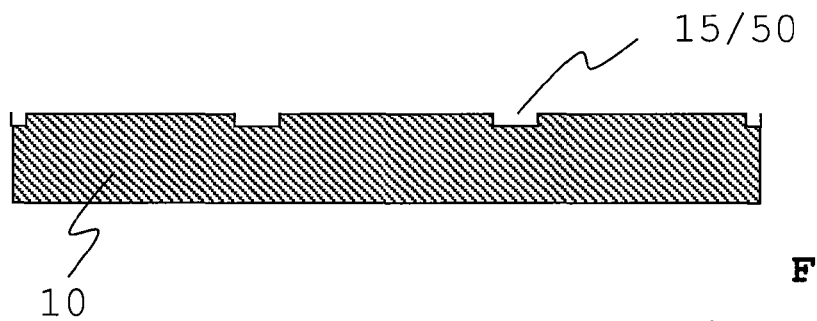
Fig. 7.b
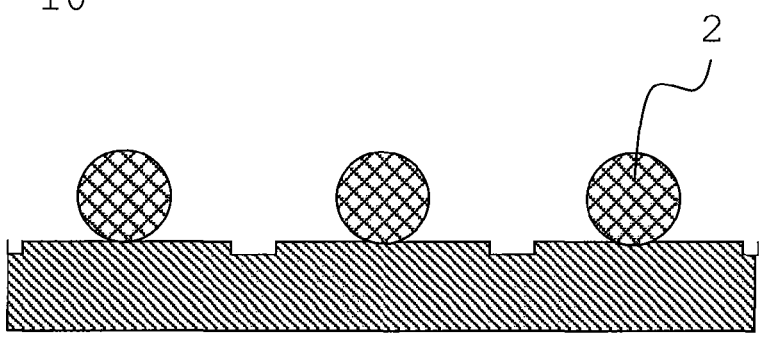
Fig. 7.c
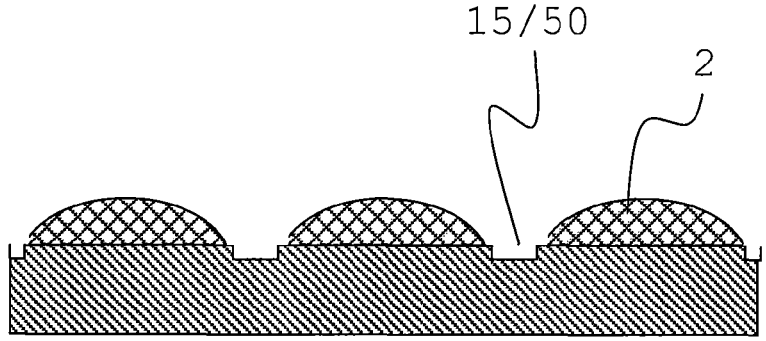
Fig. 7.d

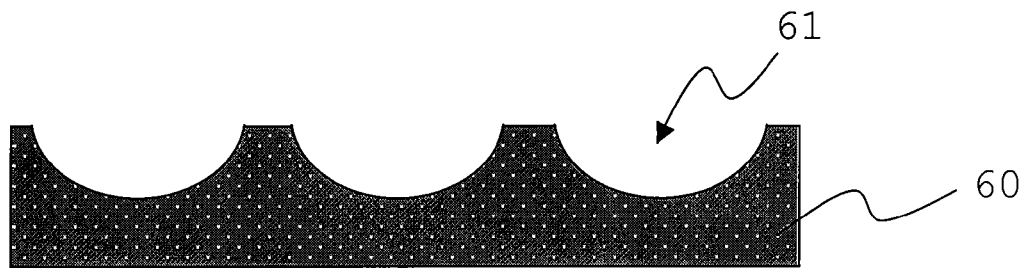
Fig. 8.a
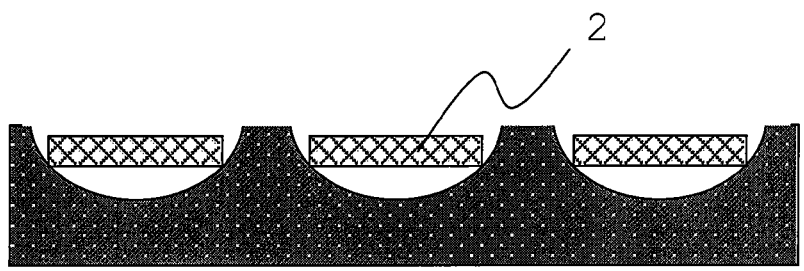
Fig. 8.b
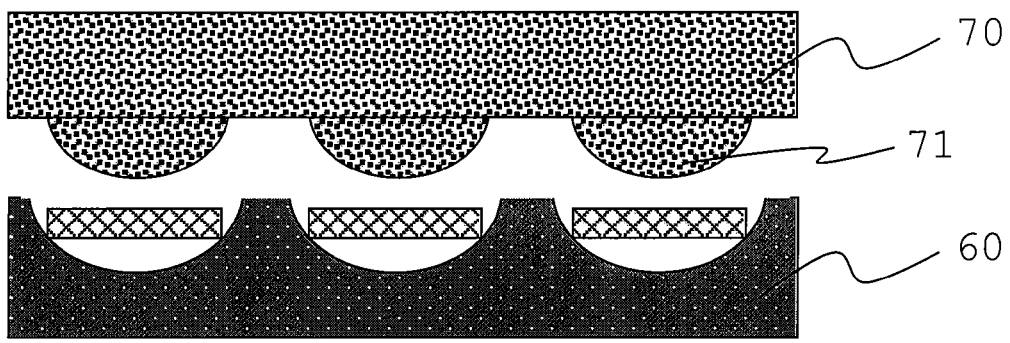
Fig. 8.c
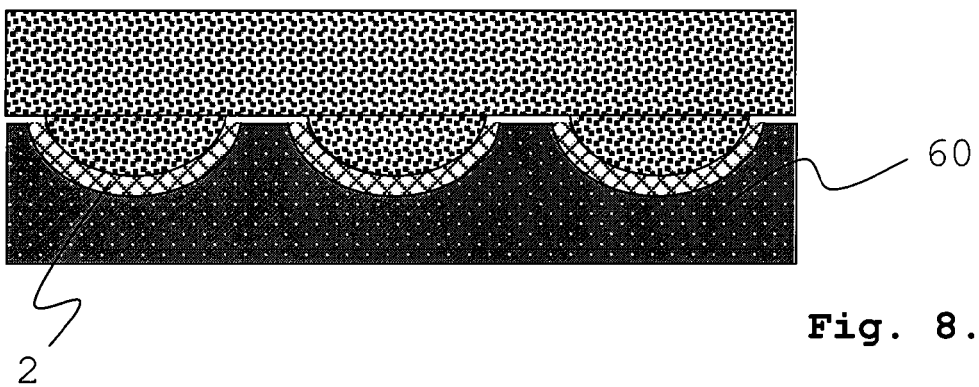
Fig. 8.d

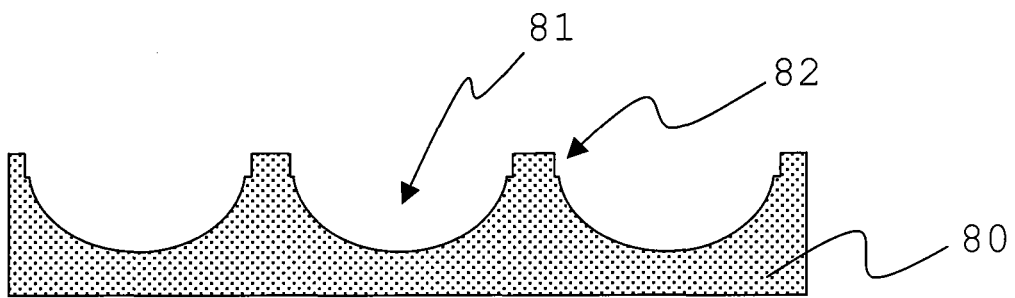
Fig. 8.e
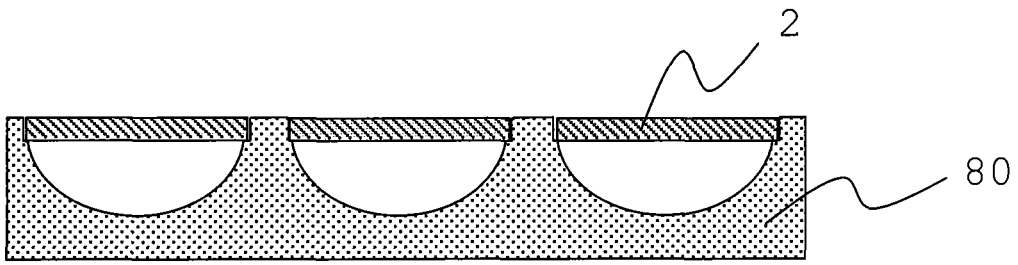
Fig. 8.f
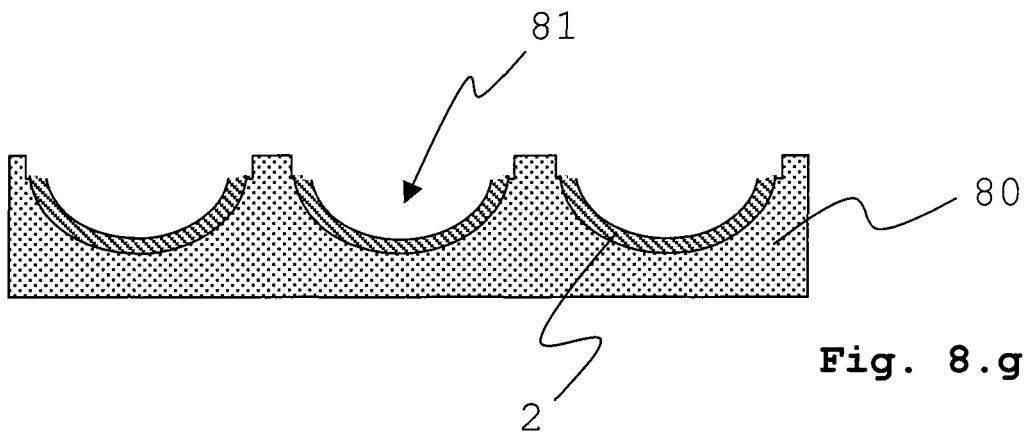
Fig. 8.g
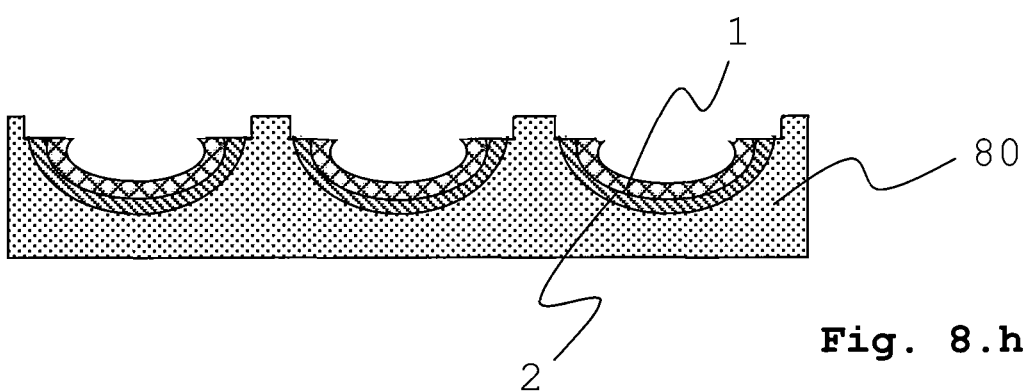
Fig. 8.h

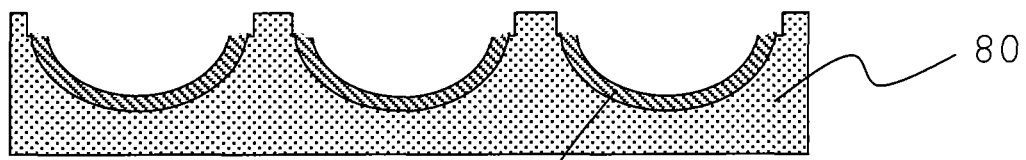
Fig. 9.a
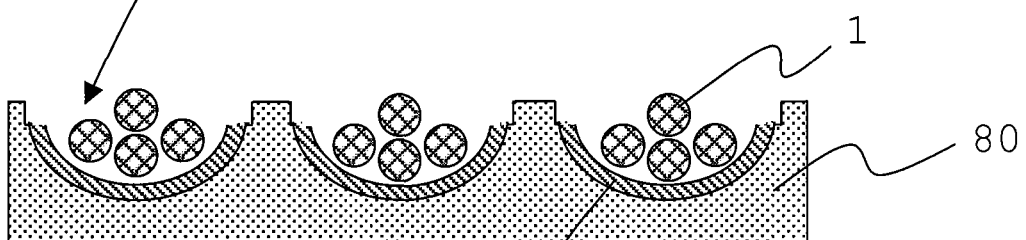
Fig. 9.b
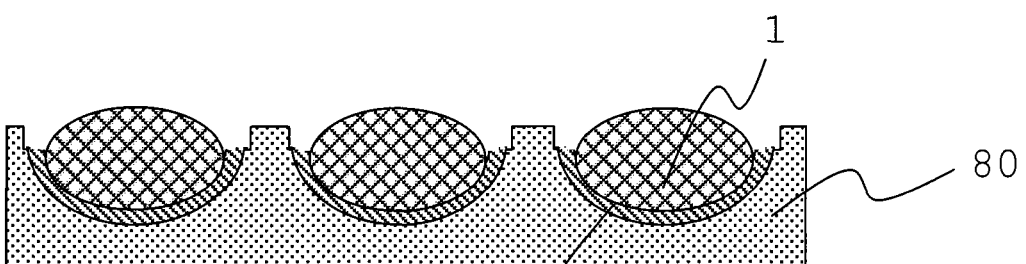
Fig. 9.c

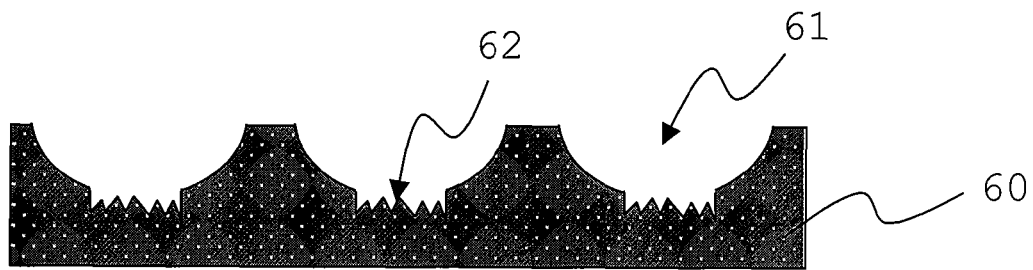
Fig. 10.a
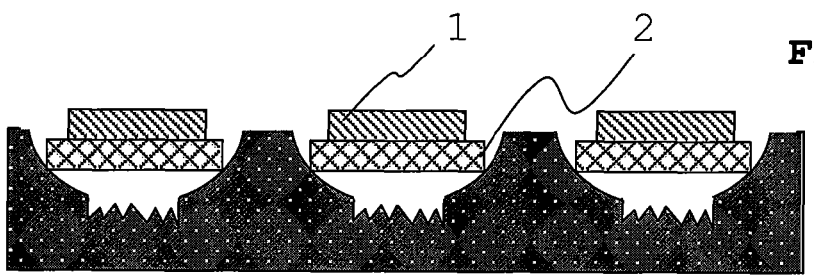
Fig. 10.b
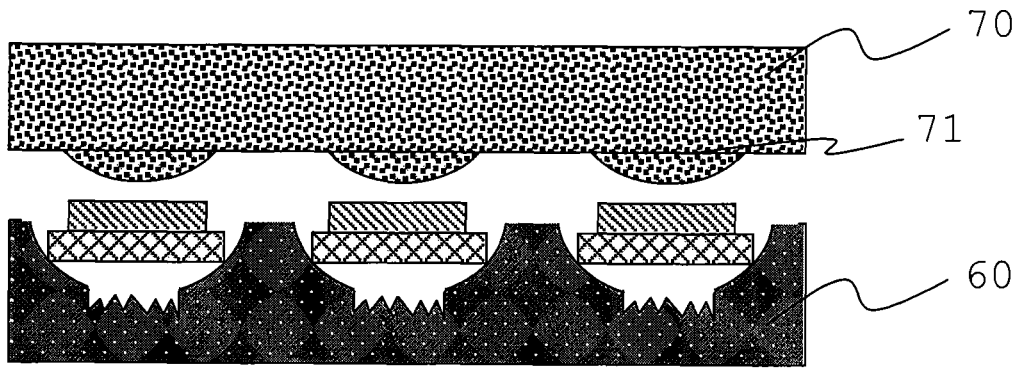
Fig. 10.c
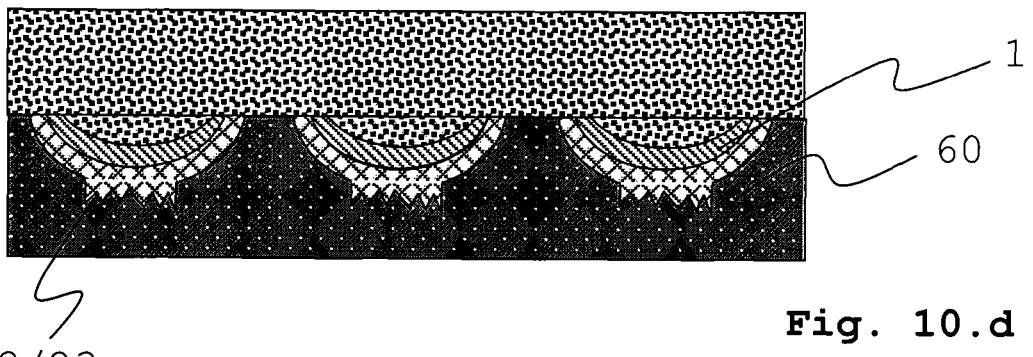
Fig. 10.d

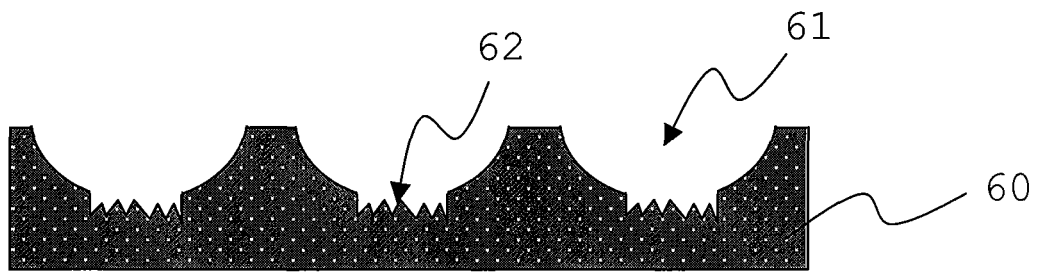
Fig. 11.a
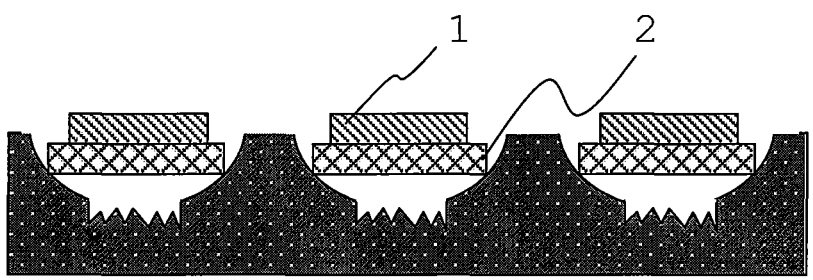
Fig. 11.b
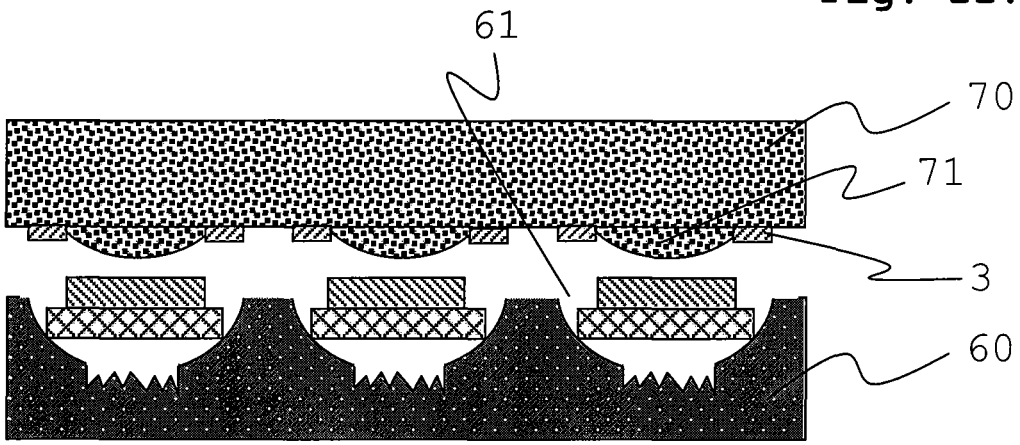
Fig. 11.c
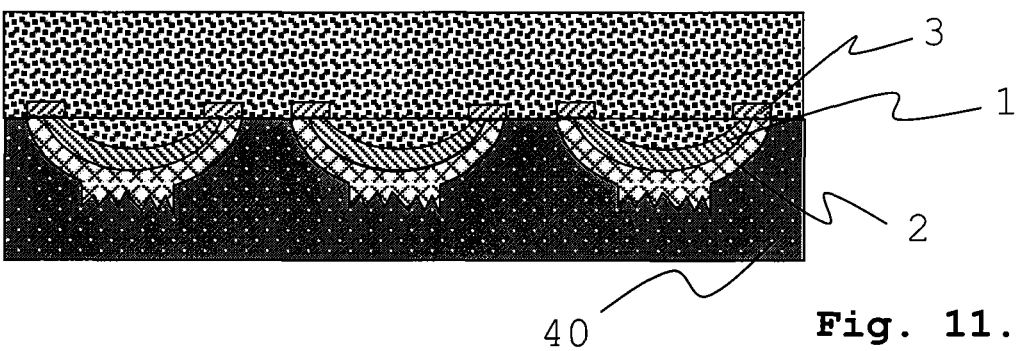
Fig. 11.d

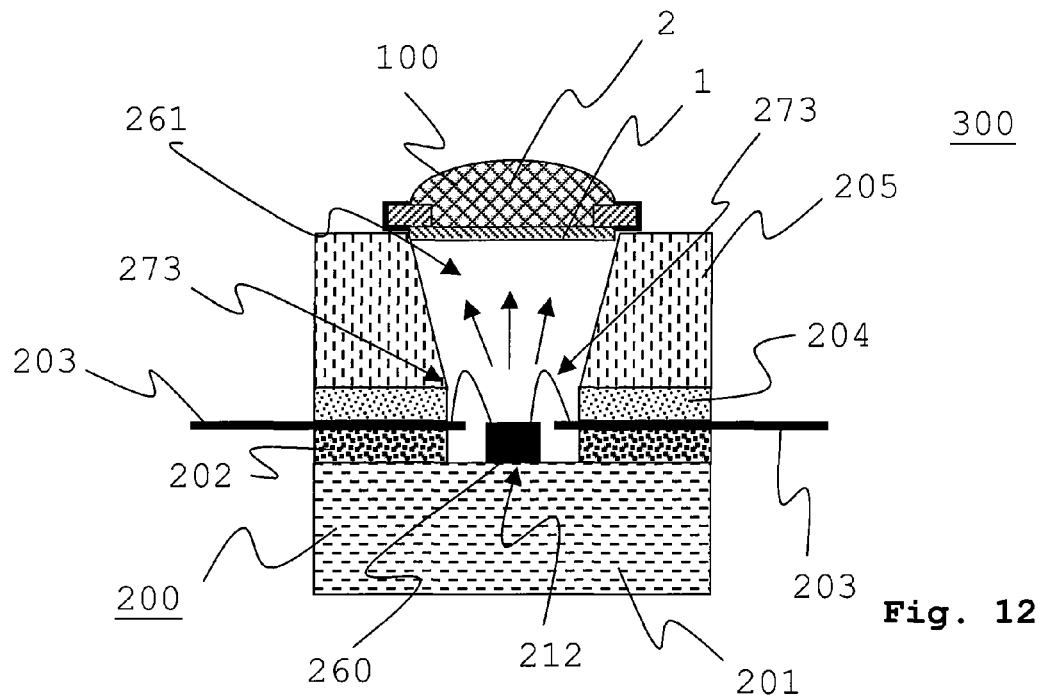
Fig. 12.a
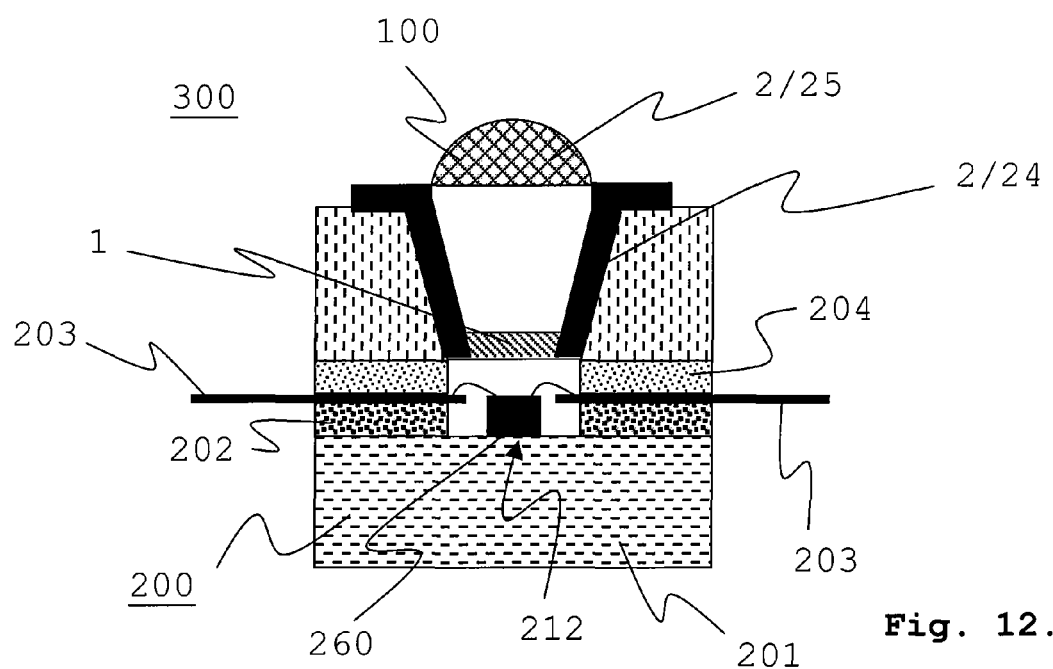
Fig. 12.b

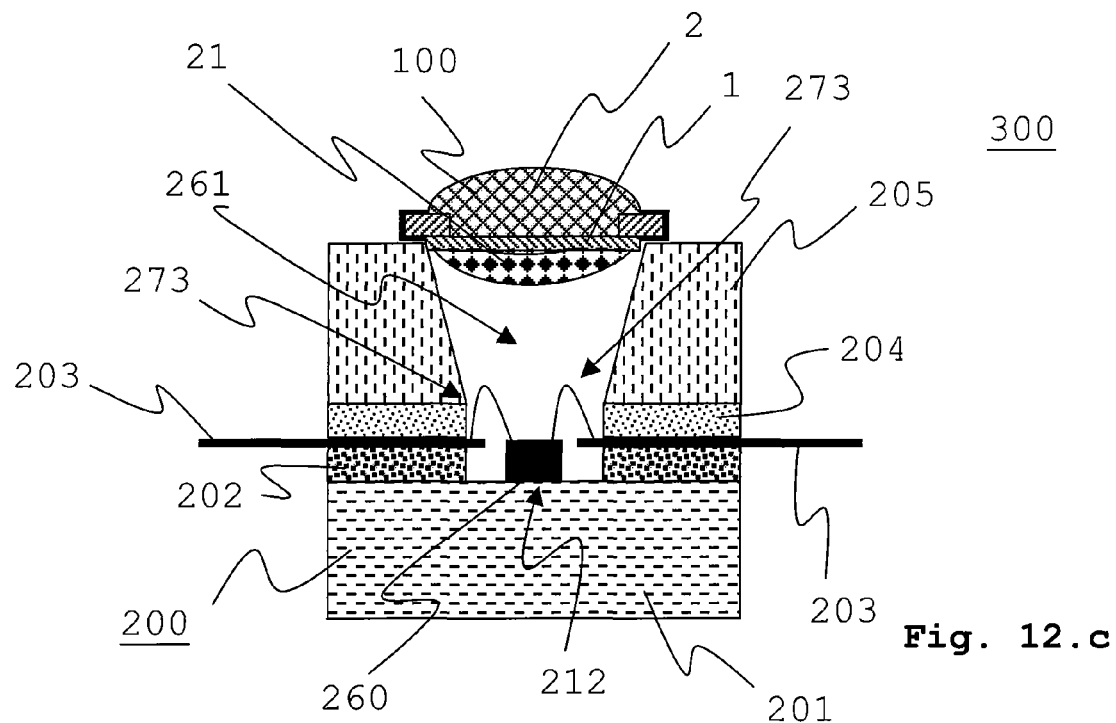
Fig. 12.c
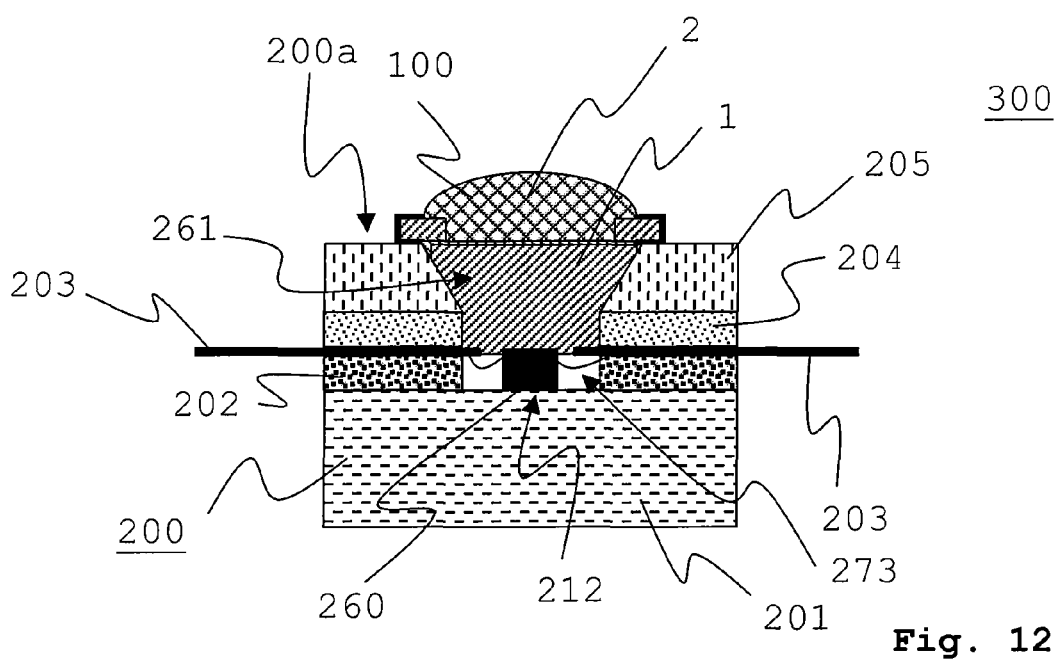
Fig. 12.d

OPTICAL CONVERTER SYSTEM FOR (W)LEDS

DESCRIPTION OF THE INVENTION

The present invention relates to an optical converter system for LEDs, preferably for so-called (W)LEDs, and a method for the production of the named optical converter system.

BACKGROUND OF THE INVENTION

At the present time, systems having LEDs, converters and optics are jointly disposed in a housing, which is also called a package, by means of so-called molding processes. In a familiar method, the package is constructed directly from the individual components, which are then solidly joined to one another. In general, silicone resins are used for this purpose. Such a system is described, for example, in document DE 10 2005 009 066 A1.

A disadvantage of such a system, which is based on its essentially organic properties, is its low temperature resistance, which in general only attains a value of approximately 100° C. Based on the low temperature resistance, such a system is compatible with soldering processes only under certain conditions, since conducting such processes will bring about or require a high evolution of heat. In particular, the materials used in the prior art cannot be exploited further if the so-called junction temperature used in an LED chip at the present time increases from the current maximum of 100-150° C. to 200° C.

Also, such a system is not resistant to UV. Further, such a package is also not hermetically sealed and is thus susceptible to environmental influences, such as moisture. The increasing complexity of semiconductor components and different applications, however, requires a hermetic package. Examples of this are an LD and a photodetector or an LED with color monitor.

Another disadvantage of the known systems is based on the fact that they are not resistant to aging. In particular, the so-called degassing effects of plastics lead to an aging of the semiconductor chip. The preferably low wavelength of the emitted light in the case of the currently used materials leads to a degradation of the optical properties and of the adhesion mechanisms. In addition, a low heat conductivity of the plastics used, which particularly lies in a range of <1 W/mK is also a disadvantage.

The individual components are generally solidly joined to one another and provided in a package. A flexible matching, particularly of the index of refraction of the individual components to one another and to the wavelength of the light, is also only very difficult or generally not possible. Another disadvantage is the increased expenditure in manufacture, since the individual components must be assembled.

GENERAL DESCRIPTION OF THE INVENTION

Against this background, the object of the present invention is thus to provide an optical converter system or a converter module for radiation-emitting components, in particular, for LEDs or (W)LEDs, and a method for the production of such a system, which at least avoid the above-described disadvantages of the prior art.

In particular, the present invention will also comply with future technological trends and will also be particularly suitable for mass production.

These objects will be achieved by the converter module and the method according to the independent claims. Advantageous embodiments are the subject of the respective subclaims.

Within the scope of the invention lies a converter module for the radiation emitted from at least one opto-electronic functional element and/or for the radiation being received for placing it onto the opto-electronic functional element, preferably an LED, comprising at least one, preferably inorganic, converter for the conversion of the emitted radiation and/or for the radiation being received, at least one optical component, preferably comprising an inorganic material, glass in particular, which is placed downstream and/or upstream relative to the converter in the emission direction of the opto-electronic functional element, whereby the converter and the optical component are joined or at least are joined in sections adjacent to one another. The converter and the optical component are preferably joined together in a cohesive manner.

Let it be additionally clarified here that the direction established for a radiation-emitting opto-electronic component, here the emission direction, also applies to a purely radiation-receiving opto-electronic component.

In addition, the invention is extended to a method for producing a converter module for the radiation emitted from at least one opto-electronic functional element and/or radiation being received, preferably from an LED, comprising Providing at least one converter for converting the emitted radiation and/or the radiation being received, Providing at least one optical component, Joining the converter and the optical component in such a way that the converter will be heated and/or the optical component will be heated so that the converter and the optical component will adhere to one another and form a composite.

Preferably, the converter and/or the optical component is or are heated so that the converter and/or the optical component soften at least in sections.

The converter module according to the invention can be produced or is produced, particularly with the method according to the invention. The method according to the invention is preferably designed for the production of the converter module according to the invention. In one embodiment of the invention, a plurality of converter modules according to the invention is provided and/or produced in one array or one line.

The converter module is formed by at least two components. These two components are the optical component and the converter as the converter component. The converter module is a multi-component system. The individual components or elements are joined structurally into one functional unit and form the converter module. The components are matched to one another relative to their functions. The converter module is a separate component as such. A converter module is not to be understood as an optical component, such as, for example, a lens, in which luminous substances are embedded in sections for conversion. The converter module is a module for a modularly constructed opto-electronic component. Therefore, the converter module will also be designated as a converter module or as an optical converter system. The total height of the converter module lies in a range of approximately 0.4 mm to 10 mm. It also has an average diameter of approximately 1 mm to 20 mm. In one embodiment, the converter module is an inorganic converter module or a substantially inorganic converter module.

In one embodiment, the converter module is designed in such a way that it can be positioned and/or attached over a pass-through region for the radiation emitted by the opto-electronic functional element and/or for the radiation being received. In one use, the converter module is a type of lid, cover or closure for a housing, which is also called a package. The converter module can be joined to the housing. In this case, the converter module can be placed directly on the housing or the opto-electronic functional element. Due to its modular character, however, the converter module can also be placed on the housing or the opto-electronic functional element via an adapter. Preferably, at least one opto-electronic functional element is disposed in the package. The package can be a GTMS package ("Glass To Metal Seal"), Si package, a plastic package, and/or a ceramics package. The package is preferably a package that is described by the name "Housing for LEDs with high power" in a Patent Application. This named Patent Application was filed on the same day as the present Patent Application and has the internal file number 08SGL0060DEP or P3063. The scope of this Patent Application is incorporated to the full extent in the present Patent Application.

The opto-electronic functional element is a radiation-emitting and/or a radiation-receiving component. Preferably, the functional element is designed as a chip. The functional element is at least one component selected from the group of LEDs, photodiodes and laser diodes. A first preferred LED has an emission in a range of approximately 370 nm to approximately 410 nm. A second preferred LED has an emission in a range of approximately 440 nm to approximately 480 nm. The use of the converter module according to the invention is particularly suitable also for LEDs with a high power, preferably with a power of more than approximately 5 W, since in these LEDs, an efficient drawing off of heat is necessary, and in addition to the housing, the converter module must also be sufficiently heat-stable.

The converter module is suitable for placement on the opto-electronic functional element and/or on a housing. The converter or the converter module, on the one hand, can be placed directly on the LED or the opto-electronic component. The converter is in contact with the LED. As an alternative, the converter or the converter module can be placed at a distance relative to the LED.

The converter converts at least a part of a primary radiation to a secondary radiation, which has a wavelength that is different from the primary radiation. On the one hand, the primary radiation can be emitted from the opto-electronic functional element. On the other hand, the secondary radiation can be received by the opto-electronic functional element. In this case, first, the interaction between opto-electronic functional element and converter is substantial. In particular, the interaction between the primary radiation and the secondary radiation emitted by the converter is substantial.

In the case of a radiation-emitting opto-electronic functional element, such as an LED, in a preferred embodiment, a so-called white LED results due to an interaction between the opto-electronic functional element and the converter. The light emitted from a receiver is perceived as white light. A so-named (W)LED is formed. In this case, the white light is formed by an additive color mixing.

In one embodiment, the converter is an inorganic converter or a substantially inorganic converter. An inorganic or a substantially inorganic converter is a converter whose thermal and/or converting properties is/are determined for a long time afterward by its inorganic components. In particular, the material for the matrix, in which the luminous substances are embedded, is provided by at least one inorganic material. It has a temperature resistance of at least up to approximately 150° C., preferably of up to approximately 250° C., and particularly preferred of up to approximately 500° C. The application range particularly preferably lies in a range from approximately −80° C. to approximately 500° C. A change in the color coordinates as a function of temperature is reduced in comparison to the known organic materials. Also, in comparison to the usual organic converter materials, it possesses a clearly greater heat conductivity of more than approximately 1 W/mK. The converter has a refractive index in a range from approximately 1.5 to 2.0. The converter has a $T_g$ (glass transition temperature of more than approximately 500° C. The converter has the property of converting a primary radiation or at least a portion thereof into a secondary radiation of at least a longer wavelength. The converter possesses its converting properties due to an embedding or doping of corresponding light-emitting materials, luminous substances or crystals (e.g., Ce:YAG) and/or due to its structural assembly or crystal structure. The converter is composed of at least one material or comprises at least one material selected from the group of opto-ceramics, glass ceramics, ceramicized glass and PiG (phosphor in glass). Preferably, the material for the converter is at least one material that is described in the Patent Application with the name "Conversion material, in particular for a white or colored light source comprising a semiconductor light source, method for the production thereof, and light source comprising this conversion material. The named Patent Application was filed on the same day as the present Patent Application and has the internal file number 08SGL0097DEP or P3179. The scope of this Patent Application is incorporated to the full extent in the present Patent Application.

In general, the converter is a type of plate or converter plate. The converter is essentially not plastically deformable at temperatures commonly used. In one embodiment, the converter is designed multi-stage or multi-layered. In such case, it is at least 2-stage or 2-layered. The individual layers can have different conversion properties, particularly with respect to the primary radiation to be converted and/or the generated secondary radiation. However, scattering and/or diffusor centers may also be present in the individual layers.

The converter may also have, for example, at least one coating on the outer side, at least one structuring or structure in the surface and/or particles embedded in its bulk or volume. For example, a coating may be an anti-reflection layer, particularly a wavelength-selective, anti-reflection layer, which is preferably disposed on the bottom side of the converter. Further, a coating of the converter, preferably on its top side, may also be produced with optical filters, e.g., anti-reflection coatings or bandpass filters, in order to homogenize, e.g., color spectra. A structuring may involve, for example, a surface of the converter treated by roughening, preferably its bottom side and/or its top side. A targeted roughening of the converter surface may be produced, for example, by etching and/or sandblasting, in order to increase the decoupling efficiency. Scattering and/or diffusor centers are examples of embedded particles. Therefore, in one embodiment, the converter or at least a layer of the converter has a coating, a structuring and/or embedded particles, in particular, at least in sections or completely, preferably in the top side and/or the bottom side. For this purpose, the surface of the converter can also be etched, smoothed, roughened, polished, and/or ground down.

The height or thickness of the converter in general lies in a range of approximately 0.05 mm to 1 mm. In one variant according to the invention, the converter is planar or substantially planar. In another variant, the converter is not planar. The converter 1 is designed as curved or curved in sections. The optical component is also curved or curved in sections in one embodiment. The curvature of the optical component is preferably adapted to the curvature of the converter.

Further, the indices of refraction of the converter and the optical component are also matched to one another. The difference between the refractive index of the converter and that of the optical component in this case amounts to less than 0.4, preferably less than 0.1.

Next, the interaction of opto-electronic functional element, converter and optical component is also substantial. The converter and the optical component are joined together directly or indirectly. Preferably, however, the converter and the optical component are joined together directly. They are particularly joined together in a cohesive manner. The phrase "converter and optical component adjacent to one another" is also understood to mean a contact via an adhesive, solder or binder. The optical component is substantially transparent to the primary radiation and/or to the secondary radiation. In one embodiment, the optical component is substantially transparent to the radiation from the LED and to the radiation emitted from the converter.

An optical component is a component by means of which the beam path of the radiation that is emitted from the converter and/or from the opto-electronic functional element, and/or is received by it, is influenced in a targeted manner, in particular, it is guided and/or deflected. For example, an influencing is a deviation from the linear propagation of light, which is caused by refraction, reflection, scattering and/or diffraction.

An optical component is designed, for example, as an optical system with imaging properties, such as a concave and/or convex lens, a light filter, a diffusor, a light guide, a prism, a so-called DOE ("Diffractive Optical Element") and/or a concentrator. If the optical component is designed as a concentrator, then in a variant of the invention, it is disposed on the top side of the converter or downstream relative to the converter. In this case, in another embodiment, yet another optical component, such as a lens, is disposed on the concentrator or downstream relative to the concentrator. The concentrator is composed of or comprises glass and/or plastic.

The enumeration of the above-listed examples of an optical component is not all-encompassing. In the following, the optical component is also called optics. An optical component, in particular, is not to be understood as a "simple", especially sealing, cover or shell, such as a plate or glass plate. However, an optical component may also be a "simple" unit, such as a transparent plate or glass plate, if it has the desired properties influencing light due to an appropriate design or treatment, for example, of its surface and/or its volume. The unit may have, for example, at least one coating on the outer side, at least one structuring or structure in the surface and/or particles embedded in the material. A coating may be, for example, in particular, a wavelength-selective anti-reflection layer. A structuring can be, for example, a surface of the optical component that is treated by roughening. Scattering and/or diffusor centers are examples of embedded particles. Therefore, in one embodiment, the optical component has a coating, a structuring and/or embedded particles, in particular, at least in sections or completely, in the top side and/or the bottom side. For this purpose, the surface of the optical component can be etched, smoothed, roughened, polished, and/or ground down. However, an optical component may also be a "simple" unit, such as a transparent plate or a glass plate, if this plate represents a type of transition or introduction to the actual optical component that influences light. The optical component would then be joined indirectly to the converter. This unit could also be joined indirectly with the converter.

The optical component has a $T_g$ (glass transition temperature) of less than approximately 800° C. The material or the glass of the optical component has a $T_g$ which is approximately 50 to 300° C. below the $T_g$ of the converter. In one embodiment, the optical component is an inorganic optical component or a substantially inorganic optical component or an optical component made of glass or comprising glass. In one embodiment, the glass is a milk glass. The glass of the optical component is at least a material, preferably a glass, which has a $T_g$ of less than approximately 800° C., in particular, as a function of the method for producing the converter module. Examples of this are SCHOTT 8337, P-SK 57, 8250 and P-LASF 47. The material of the optical component can also be an inorganic, monocrystalline or polycrystalline material, such as, e.g., sapphire. The material of the optical component has a refractive index in a range of approximately 1.4 to 2.0. It also has a temperature stability of more than approximately 400° C.

In one embodiment, the optical component is formed by a plurality of smaller optical components. These are preferably disposed in one plane on the converter in this case.

In an enhancement of the present invention, the converter module according to the invention has another optical component, which is disposed on the opposite-lying side of the converter. The other optical component is mounted upstream or downstream relative to the converter in the emission direction of the opto-electronic functional element. For example, the light emitted from an LED can be bundled onto the converter by means of a convex lens. The other optical component in this case may have the same properties or may be equally provided as the above-described first optical component. In order to avoid repetition, reference is thus made to the corresponding parts of the description. In one embodiment, a concentrator, preferably as another optical component, is disposed on the bottom side of the converter or upstream relative to the converter, in particular, for bundling the light emitted from an LED.

In one embodiment according to the invention, the converter module has at least one ring, preferably a metal ring, which extends at least in sections, or completely over the peripheral extent of the converter module. On the one hand, the ring can represent a limit for the defined melting or fusing of the optical component. Therefore, the ring is generally provided before the optical component is provided or before a glass gob is melted for the formation of the optical component. On the other hand, the ring is a type of support for the converter module. In addition, the housing can be joined to the converter module by means of the ring. The ring is generally applied both to the converter as well as also to the optical component. The ring may also serve as a cooling unit for the converter module. Therefore, the latter preferably has materials that possess an appropriate heat conductivity, such as a metal or a metal alloy. Preferably, the ring possesses a heat conductivity of at least approximately 10 W/mK. The ring is used or not used as a function of the housing or of the joining of the converter module with the housing.

In another embodiment of the invention, the ring has, at least in sections or completely, a preferably metal coating or cladding. The coating is preferably a metallizing. The metal coating or cladding is disposed, in particular, on the free-lying part of the outer side. In detail, the contact region to or the bearing surface on a housing is coated or clad. The coating or the cladding is a corrosion protection for the ring and/or a binder, such as a solder material, for joining to the housing.

Another design of the converter module has at least one means for drawing off heat. The means is provided, for example, by at least one metal layer and/or a diamond layer (e.g., "synthetic diamond"). One metal with a high heat conductivity is copper, for example. The means is provided as a type of wire or conductor, preferably formed as a type of network or grid. It may involve a printed circuit, which can also be called thermal busbars. The means is integrated on the bottom side of the converter, on the top side of the converter and/or in the converter. In the case of so-called arrays, this means runs essentially between the optical components. In one embodiment, the means runs around the optical component.

In an enhancement of the invention, the optical component is processed or treated at least in sections. Preferably, the top side and/or the bottom side of the optical component is processed. The processing may be or may comprise a structuring and/or a coating. In order to achieve, for example, an improved illumination, the optical component can be roughened. An increased diffuse reflection is obtained. That is, the incident light from a specific direction is scattered into many different directions. The optical component, however, can also be designed, in particular, as wavelength-selective and reflecting.

The converter, the converter material, the glass gob, the optical component, the material for the optical component and/or the ring is or are provided or positioned by means of a so-called "pick and place process" in one embodiment.

A mold for the uptake of at least one converter and/or at least one optical component or at least one glass gob or at least one preform is provided in one embodiment. The respective components named above are provided via a positioning on or in the mold. Positioning on the mold is understood to mean that the components are placed on the surface of the mold. A section or at least one section of its bottom side is in contact with the surface of the mold.

According to one aspect of the invention, the optical component is provided in a first step. In this case, the optical component is provided via a melting. Providing the optical component comprises providing a mold, positioning a glass gob on or in the mold, and heating the glass gob until the material has reached a viscosity at which the material is free-flowing and the optical component forms. In this case, the material preferably sinks into the mold. Here, the optical component can also be provided as a glass gob or a preform, from which the optical component is then formed via a melting ("reflow"). In order to avoid repetition, reference in this regard is made to the following corresponding description.

Subsequently, a processing, particularly a surface processing, of the optical component is conducted. The properties of the optical component are improved and/or adjusted by the processing. After the processing, the optical component is joined to the provided converter.

A first possibility for processing is etching the optical component, preferably by means of HF and/or HCl. Etching has proven advantageous for the case when the optical component will also possess the properties of a diffusor. An additional treatment of the optical component for producing this function is no longer necessary.

However, if a particularly smooth surface is to be obtained, in particular, a smoothing or a polishing, preferably a fire polishing, of the surface of the optical component can be subsequently conducted.

Grinding down the optical component represents another possibility. The surface of the optical component can be smoothed, roughened, and, in particular, a structure can also be produced by grinding. A roughness of the surface can be produced, so that the property of a diffusor is formed. On the other hand, the side of the optical component on which the converter will be disposed may also be ground down, preferably planar ground, and/or polished.

The converter or the material of the converter is provided by introducing it onto the optical component, preferably onto its bottom side. The converter is provided by printing, such as screen printing and/or by means of a template, by dispensing, by sintering, preferably a compact or preform, and/or by laminating a foil. A foil can be provided, for example, by a slip cast in the form of a strip.

In an unsintered embodiment of the optical component, such as for unsintered PiG, the converter is provided by printing, laminating, sintering, sintering and/or dispensing. In a pre-sintered embodiment, such as for PiG and/or ceramicized glass and/or glass ceramics, the converter is provided as a tape and/or as a sintered compact. Providing an organic converter represents another alternative.

The converter and the optical component are joined with one another in a subsequent step. The joining is preferably achieved by sintering the converter. The sintering can be conducted with or without pressure.

According to another aspect of the invention, initially the converter is provided in a first step. In a first embodiment, the converter is provided as a layer or a type of plate. Here, the converter is a molding. It is thus essentially dimensionally stable. The molding has its own stability. In this case, the molding can be dimensionally stable, but still be deformable. The converter is preferably positioned in a mold.

In another embodiment, the converter, preferably for a PiG converter, is first provided as a pourable material, which is positioned in a mold or introduced into a mold. A pourable material is a material that is provided essentially as small converter particles, such as, for example, as a type of powder or beads or grains.

In a subsequent step, the converter or the configuration of the converter will be formed by pressing the pourable material or particles. The particles adhere together mechanically. A molding is formed. Based on the applied pressure, this can in fact lead to a type of cold welding of the particles at their contact surfaces. In addition to the pressing and/or after the pressing, the formed molding or the pourable material, which forms the converter, can be heated so that the particles adhere to one another. The converter is thus provided or produced via a sintering process.

The optical component is provided in the next method step. In this case, the optical component is positioned on the converter.

In one embodiment, the optical component is provided as is. In this case, it essentially already has its "final" configuration. The converter and/or the optical component are heated so that they adhere to one another and form a composite. They are joined via sintering.

In another embodiment, the optical component is formed by a pressing and/or heating a pourable material from which the optical component is formed. The optical component is thus likewise produced via a sintering process. It is, so to speak, a type of 2-step sintering.

In another embodiment, which represents a type of 1-step sintering, the mold is filled sequentially. The converter and the optical component are provided in such a way that the mold is first filled with the material that will form the converter, and then is filled with the material that will form the optical component. Each of the two materials is preferably a pourable material. On the one hand, the converter and the optical component are formed via a common pressing and/or heating of the two materials, and simultaneously to this, the composite made up of converter and optical component is also formed.

In another embodiment of the invention, the optical component is provided in such a way that the optical component is provided as a glass gob or a preform. The glass gob is also called a glass section.

A glass gob or a preform is a molding from which the optical component is formed or shaped by heating or melting. The optical component is formed by a defined collapsing or folding together of the molding or of the glass gob due to the reduced viscosity caused by its heating. The shape of the molding can be adapted to the shape of the optical component to be formed. The molding can also be porous. It can also be multi-part. In this case, in one embodiment, the glass gob or the preform is placed on the converter, compressed and/or joined with the converter.

In another embodiment, the glass gob or the preform is provided via a so-called "jetting" method. This name designates a method in which the glass or the material is provided in such a low-viscous state, that it can be sprayed on, so to speak, or applied dropwise. The viscosity lies in a range of approximately $10^2$ dPas to approximately $10^4$ dPas. For illustration: The named "jetting" method, for example, is similar to the mode of operation of an ink-jet printer.

In another embodiment, the glass gob or the preform is provided via a structuring or a so-called micro-structuring. For this purpose, in one variant, a vitreous body or object, preferably a plate, is placed on the converter and/or is produced on the converter by means of a deposition method, such as, for example, PVD ("Physical Vapor Deposition"). In the first named version, the vitreous body or the object is placed on the converter, pressed, and/or joined with the converter, for example, by means of sintering. Optionally, the vitreous body or the object is or will be heated prior to the structuring, until it attains or possesses a viscosity at which it adheres to the converter. The vitreous body or object is "sintered" onto the converter. The glass gob or the preform is produced by a material-abrading method. In this case, the method comprises the following steps: 1.) Introducing a mask onto the vitreous body or object, which maps the structure of the glass gob or the perform, 2.) Removing the free-lying regions of the vitreous body or of the object by means of lift-off technology, and 3.) Removing the mask. The glass gob or the preform remains on the converter. In another variant of the structuring, first a mask is introduced onto the converter, which maps the structure of the glass gob or the preform. In a next step, a vitreous body or an object is deposited on the converter by means of a deposition method, such as, for example, PVD ("Physical Vapor Deposition"). The mask, i.e., the regions of the mask that cover the converter, are removed by the so-called lift-off method. The glass gob or the preform remains on the converter.

In another embodiment, the glass gob or the preform is heated until it attains or possesses a viscosity at which the material adheres to the converter. The glass gob or the preform is "sintered" onto the converter. A composite is formed.

In a next step, the glass gob or the preform is heated and when it is molten or of low viscosity, the first optical component is formed, preferably as a substantially semispherical lens. Such a melting is named as so-called "reflow". Therefore, the optical component as defined can be formed if the material is heated to a viscosity that lies in a range of approximately $10^3$ dPas to approximately $10^8$ dPas. For this purpose, the material or the glass of the optical component has a $T_g$ which is approximately 50 to 300° C. below the $T_g$ of the converter.

In order to be able to melt the glass gob or the preform in a defined manner, limits or at least one limit will be provided or disposed over and/or on the side of the converter, onto which the optical component will be introduced. The limit is a type of boundary or mold insert for the collapsing or melting of the glass gob or the preform, so that the optical component can form in a defined manner based on the surface tension. A convex lens is preferably formed substantially as the optical component. The limit extends at least in sections or essentially completely over the peripheral extent of the glass gob or the preform. It defines a boundary for the size and the shape of the optical component that is being formed. The shape and the size of the limit are formed at least in a base region of the optical component.

In one embodiment, the limit is a discontinuity in the surface or the side of the converter, on which the optical component will be introduced or formed. For example, it is a type of discontinuity in a planar plane. Preferably, a plurality of smaller optical components may also be produced in this way on a converter.

The limit will be produced by a structuring of the side of the converter on which the optical component will be introduced or formed.

In this case, in one embodiment, raised structures or crosspieces will be produced on the corresponding side of the converter. In one embodiment, the limit will be produced via an additive or material-applying method. One embodiment for producing the limit is introducing a separate layer. The material for forming the separate layer is at least a material selected from the group including metal, glass and glass ceramics. The limit is introduced, for example, via a coating process, such as vapor deposition, and/or bonding, such as adhesion and/or sintering, and/or screen printing.

In another embodiment, the limit is produced by a material-abrading method or a correspondingly configured production method for the converter. In this case, recesses, such as slots and/or grooves, are produced or introduced on the corresponding side of the converter. These are named as so-called "V grooves". The limits are introduced, for example, via sandblasting, etching, such as RIE ("Reactive Ion Etching"), ultrasonic machining, sawing, and/or laser ablation.

In another embodiment, a limit is provided by positioning a type of template, which is preferably positioned just above or on the top side of the converter. The template can preferably be removed again after melting. The template, preferably at least, is composed of a material that does not adhere to the viscous glass gob or to the viscous preform. An example is graphite. The template is designated a fixation in the following.

In another embodiment, in a first step, the optical component is provided first. In this case, the first optical component essentially already has its "final" configuration.

In a subsequent method step, the converter is now provided and joined with the optical component. The optical component will be applied onto the converter. Possible methods for introducing the converter are screen printing, pyrolysis, introducing a foil, flame pyrolysis, and/or a CVD ("Chemical Vapor Deposition") process and/or the introduction of a so-called microstructured glass.

According to another aspect of the present invention, the converter is positioned via a mold, preferably as a molding. In a next step, a heating is conducted, at least of the converter, until the material of the converter reaches a viscosity at which the converter sinks into the mold. Therefore, the converter can be formed in a defined manner, if the material is heated to a viscosity that lies in a range of approximately $10^5$ dPas to approximately $10^8$ dPas. In order to make possible a defined sagging of the converter, the latter possesses an average thickness or height of approximately 0.05 mm to approximately 0.5 mm.

In the embodiment in which the optical component is provided directly or already formed, it can be placed on the converter, preferably while the converter is still in the heated and thus "adherent" state and/or is pressed on it, so that a composite is formed of the converter and the optical component.

In another embodiment, the providing of the optical component comprises providing a glass gob or a preform, which is positioned together with the converter on the mold. The glass gob or the preform is disposed on or under the converter. Each time depending on the embodiment, the glass gob or the preform can be positioned before, during and/or after the sinking of the converter.

The glass gob or the preform and the converter are heated until they each reach a viscosity at which the converter and the glass gob or the preform sink into the mold, in particular jointly or sequentially. The converter and the glass gob or the preform adhere to one another. A composite is formed. In the sinking or sagging, the optical component is also formed at the same time from the glass gob or the preform.

In one embodiment, the glass gob or the preform, preferably after the converter has sunk, is heated and melted until the material reaches a viscosity, at which the optical component is formed, preferably as an essentially semispherical lens. Such a melting is named a so-called "reflow". For further details or improvements of the "reflow", in order to avoid repetition, refer to the corresponding description.

According to another aspect of the invention, the converter and the glass gob or the preform or the optical component are disposed in a mold, sequentially or simultaneously. The converter and the glass gob or the preform or the optical component are joined together by pressing, preferably by so-called blank pressing, and heating. In the case of the glass gob or the preform, the optical component is formed simultaneously during the pressing.

In one embodiment, the contact surface of the mold, preferably the contact surface relative to the optical component is provided structured, at least in sections. Thus, when the two components, i.e., the converter and the optical component, are joined, a structure, such as a DOE structure or a micro-optics structure, can be introduced into the converter and/or the optical component. For example, in this case, the structure of a Fresnel lens can be impressed in the top side of the optical component.

According to another aspect of the invention, the converter and/or the optical component is or are provided as such. Here, each has already essentially reached the "final" configuration. The converter and/or the optical component is or are produced, for example, by pressing, preferably by so-called blank pressing.

In one embodiment, the converter and the optical component are joined by means of an organic bonding, such as gluing, and/or an inorganic bonding, such as sintering, sol-gel bonding and/or diffusion bonding. In one variant, the converter and/or the optical component is or are heated until they adhere to one another and form a composite.

Not only can a single converter module be produced and/or provided alone, but rather a plurality of converter modules can be produced or provided jointly. Thus, an array or an arrangement that comprises a plurality of the above-described converter modules also lies within the scope of the present invention. The array results in an embodiment in that rings are provided as the matrix. A ring, particularly when it is manufactured of a metal material, is produced by a so-called conductor frame method, such as, e.g., photochemical etching, punching, laser cutting, and/or water jet cutting. In one embodiment, a plate is structured in such a way that a plurality of rings is formed per plate. The ring is a component of a matrix of individual housings. A matrix is a type of base unit, in which the rings are embedded or disposed. The individual rings are fastened to the respective matrix by means of so-called crosspieces or connection rods.

In addition, the invention extends to an opto-electronic component, which comprises at least one housing, at least one converter module according to the present invention and at least one opto-electronic functional element, in particular an LED, which is disposed in the housing. In one embodiment, the opto-electronic component has at least one LED and at least one monitoring component, such as, for example, a photodiode, and/or at least one thermocouple. These are disposed on the opto-electronic component, preferably in the housing. The light intensity of the LED can be monitored and/or regulated by means of the monitoring component. The temperature of the LED can be monitored and/or regulated by means of the thermocouple.

Further, a lighting device that contains at least one converter module and/or an opto-electronic component according to the present invention also lies within the scope of the present invention. Examples of the lighting device are a seat lighting; a reading light; a work light, which can be integrated into ceilings or walls in particular; an object lighting in furniture and/or buildings; a headlight and/or a rear light and/or an inside lighting and/or an instrument or display lighting, preferably in motor vehicles; and/or a background lighting for LCD displays.

The present invention will be explained in detail on the basis of the following embodiment examples. Reference is made hereto to the appended drawings. The same reference numbers refer to the same parts in the individual drawings.

FIGS. 1.a to 1.i show schematically different embodiments of the optical converter system according to the invention.

FIGS. 2.a to 11.d show schematically different embodiments of the method for producing the optical converter system according to the invention.

FIGS. 12.a to 12.d each show schematically an optical converter system having a package or housing in the assembled state.

DETAILED DESCRIPTION OF THE INVENTION

FIGS. 1.a to 1.i show schematically different embodiments of a converter module 100 according to the invention, which is designated below as optical converter system 100, in a cross section. The system 100 presented in FIG. 1.a is composed of a converter 1, an optical component 2, which is called optics 2 below, a metal ring 3, and a layer 4, which is preferably applied on the outside of metal ring 3. Optics 2 is disposed on the top side 1a of converter 1. Optics 2 and converter 1 are joined together cohesively. The top side 2a of optics 2 or optics 2 forms a convex lens 2, at least in sections or completely. The convex lens, for example, essentially has the form of a hemisphere. In this way, the light emitted from converter 1 can be guided, in particular, can be focussed. Metal ring 3 is fully extended over the peripheral extent of optics 2. Ring 3 essentially serves as a support for system 100 and/or for drawing off heat and/or as a positioning aid and/or as a fastening means, for example, for a housing 200. A layer 4 or a cladding 4 is presently applied onto the outer side of ring 3. Layer 4 can be formed, for example, as a cladding 4, in particular, by a deposition method. It serves essentially for corrosion protection and/or for improving the connection to a housing 200. Reference is made hereto to the remarks relating to FIGS. 12.*a* to 12.*d*.

The individual embodiments illustrated in FIGS. 1.*b* to 1.*i* correspond in part to the embodiment shown in FIG. 1.*a*. With respect to the same components, in order to avoid repetition, refer to the explanations for FIG. 1.*a* given above. The following remarks refer essentially to the differences.

FIG. 1.*b* shows an embodiment, in which converter 1 is designed as a two-stage or an at least two-stage converter system 1. A multi-stage system can also be designated a sandwich construction. Here, in particular, different converter layers 11 and 12, such as phosphor layers, for example, can be combined into a converter 1. Examples of two different converters 1 are a Ce:YAG converter 11 and a red phosphor converter 12.

FIG. 1.*c* shows an embodiment, in which converter 1 is embodied in turn as a two-stage or an at least two-stage system 11 and 13. Targeted scattering and/or diffusor centers, particularly in one layer 13, will be produced hereby. An example of such a two-stage system is a Ce:YAG converter 11 and a preferably white YAG layer 13.

It may or may not be equipped with a ring 3, depending on the use of the optical converter system 100 according to the invention. FIG. 1.*d* shows for this an embodiment of optical converter system 100, which is composed only of converter 1 and optics 2.

FIG. 1.*e* shows an embodiment in which optics 2 is constructed of a plurality of smaller optics 2. The large convex lens 2 which is shown in FIG. 1.*d* is presently exchanged or replaced by a plurality of small convex lenses 2, which are disposed on the top side 1*a* of converter 1. This makes possible comparable optical properties of optics 2 with simultaneously reduced height of optics 2.

An optical converter system 100 according to the invention is not necessarily designed only as a planar system 100. This is also visible, in particular from the configuration illustrated in FIG. 1.*f*. Converter layer 1 or converter 1 is non-planar. The converter 1 is designed as curved or curved in sections. Optics 2 is also formed as curved or curved in sections.

FIG. 1.*g* shows an embodiment, in which the top side 2*a* of optics 2 is formed as a so-called DOE ("Diffractive Optical Element") 2. An example of a DOE 2 is a Fresnel lens. This is shown in simplified form. In addition, an optional coating 14 or functional layer 14 is applied onto the bottom side 1*b* of converter 1. An exemplary embodiment of such a functional layer 14 is an anti-reflection layer 14, preferably in order to increase the light decoupling efficiency of the optical converter system 100. For example, a matching of the refractive index of converter 1 to a blue LED 260 can be produced hereby.

An increase in the light decoupling efficiency can be achieved as an alternative or additionally, by matched refractive indices between converter 1 and optics 2. For example, converter 1 can possess a refractive index of 1.8. For example, a glass with a low $T_g$, such as P-LASF 47, has a matched refractive index of 1.8 for optics 2.

FIG. 1.*h* shows an embodiment, in which another optics 21, such as a convex lens, is disposed or applied onto the bottom side 1*b* of converter 1. The light beam coming from an LED 260 can then be bundled by this additional optics 21. This in turn leads to an improved decoupling efficiency.

FIG. 1.*i* shows an embodiment, in which a means 5 for drawing off heat is disposed or applied onto the top side is of converter 1. Means 5 for drawing off heat, for example, is a grid or network made of a metal layer or diamond layer. Means 5 is coupled to metal ring 3 or or is applied to it. This leads to an improved heat discharge.

Converter 1 is preferably an inorganic converter 1 or comprises an inorganic material. Examples of materials for an inorganic converter 1 are or comprise glass ceramics, PiG (phosphor in glass) and/or ceramicized glass. As already mentioned above, ring 3 is preferably a metal ring 3. Examples of materials for metal ring 3 are or comprise NiFeCo alloys, NiFe alloys and/or preferably ferritic special steels. The material or glass of the optics is preferably matched to the properties of the converter. The glasses have a refractive index in a range from approximately 1.4 to approximately 2. Suitable materials or glasses for optics 2 can be: Glasses with high IR transmission, since these are transparent to heat radiation and/or glasses with matched coefficient of thermal expansion (CTE), in order to obtain a reduction in stress opposite converter 1 and metal ring 3 and/or transparent glasses with refractive index matched to converter 1, in order to increase the decoupling efficiencies, and/or glasses with low $T_g$, which essentially lie below the $T_g$ of converter 1. Preferably, the $T_g$ of the glasses lies approximately 50° C. to approximately 300° C. below the $T_g$ of converter 1. Suitable glasses are, e.g., glasses with a low $T_g$, such as Schott glasses 8250, T-SK57, T-LASF47. Unsuitable glasses are, e.g., P-SF67, since color changes and/or opacities may occur. The application or deposition of a coating 4 is not presented in the following figures. An example of such a coating 4 is an electroplated coating 4. A concrete execution is an SnAgCu solder. If a coating 4 is to be applied onto metal ring 3, a pretreatment of metal ring 3 is necessary in many cases. An example of a pretreatment is an etching process. This can be carried out, e.g., by means of an HF and/or an HCl acid. Thus, in a preferred embodiment, the optical converter system 100 according to the invention is an inorganic optical converter system 100.

The optical converter systems 100 according to the invention may be produced individually. It is preferred, however, to produce a plurality of optical converter systems 100 simultaneously. Components 1, 2, 3 and/or 4, which are necessary for this purpose, are each disposed or provided, at least partially, in a type of matrix 40 or array 40 or line 40. A matrix 40 can preferably contain approximately 50 to approximately 20,000 positions. FIGS. 2*a* to 11.*d* show schematically different embodiments of the method for producing the optical converter system 100 according to the invention. The production takes place each time in a matrix 40. The components necessary for this are shown in a cross section.

FIGS. 2.*a* to 2.*f* show a first exemplary embodiment of the method according to the invention. First, a support 40 is provided, in the top side of which is introduced a plurality of recesses 41 (FIG. 2.*a*). Since a plurality of recesses 41 is introduced, support 40 is also designated as array 40. Support 40 is a preferably conditioned graphite mold. In a subsequent method step, converter 1 or converter plates 1 are now positioned on the top side of support 40 or in recesses 41 (FIG. 2.*b*). In a subsequent step, the metal rings 3 are now positioned on the top side of support 40, for example, by a simple placement (FIG. 2.*c*). The positioning of converter 1, rings 3 and/or glass gobs 2, from which optics 2 are formed, can hereby be supported by so-called limiters 50 or barriers 50 (FIG. 2.*d*). These barriers 50, on the one hand, serve as melting barriers, so that the glass blanks 2 that are introduced in the following method steps can be melted in a defined manner. Barriers 50 can also be used as centering aids and thus can also be designated as adjustment pins 50. Barriers 50 can be provided, e.g., as a plate 50, preferably a graphite plate 50, which is positioned directly over the top side of support 40. In a subsequent method step, glass gobs 2, which are also designated as glass sections 2, are positioned on the top side of support 40, in detail on converters 1 (FIG. 2.*e*). Glass gobs 2 are positioned, for example, also by a placement process, such as "pick and place". Glass gobs 2 can be provided, e.g., as beads and/or as rod-shaped segments. In a next step, glass gobs 2 are melted (FIG. 2.*f*). For this purpose, glass gobs 2 are heated to a temperature of approximately 600 to approximately 1000° C. Glass sections 2 become of low viscosity and run. In each case, glass gob 2 is joined with metal ring 3 and converter 1. It is a cohesive connection. Barriers 50 and/or rings 3 form a limit for the collapsing or liquefying of glass gobs 2, so that, based on the surface tension, an essentially defined convex lens is formed as optics 2. This particularly takes place with a viscosity in a range from approximately $10^4$ dPas to $10^6$ dPas. Melting typically takes place with a time duration of approximately 1 to 15 min. During the melting, the formation of optics 2 and the joining of optics 2 with converter 1 essentially take place simultaneously.

Subsequently, the individual optical converter systems 100 are inspected. After this, they are then incorporated in a corresponding housing 200. Reference is made hereto, however, to the remarks relating to FIGS. 12.*a* to 12.*d*. The separation of the individual optical converter systems 100 or the removal from support 40 is not shown in the figures. Since components 100 in the present example are only mounted or placed in recesses 41 of support 40 or on the top side of the support, these can be simply removed. Optical converter systems 100, however, are not necessarily removed. A plurality of formed optical converter systems 100 can also be supplied to a customer in a matrix.

In order to at least reduce an adverse effect on the properties of optics 2 during the melting, the melting can be carried out in a defined atmosphere. Examples of such a defined atmosphere are nitrogen and/or hydrogen and/or argon. In order to improve the glass surface of optics 2, here for the glass optics, a fire polishing can still be conducted on the top side 2*a* of optics 2.

FIGS. 3.*a* and 3.*b* show a variant of the above-illustrated method. A method is described in which the recesses 41 in the top side of support 40 are configured such that both converter 1 as well as metal ring 3 belonging thereto are disposed in recess 41. Both converter 1 and metal rings 3 are preferably positioned by means of a "pick and place process". This is different than in FIGS. 2.*c* and 2.*d*, in which metal ring 3 is found on the surface of support 40 and converter 1 is found in recess 41. Of course, it is also conceivable that both converter 1 and metal ring 3 are positioned on the surface of support 40. In such a case, the positioning could be achieved via the above-described barriers 50. Also, converters 1 are present combined from smaller converter units 1. The individual converter units 1 are combined into a converter 1 via the composite with optics 2 to be melted.

FIGS. 3.*c* and 3.*d* show another variant of the method, in which only the metal frame 3 is positioned on the top side of support 40. Glass sections 2 are positioned and a melting of glass sections 2 is carried out in metal frame 3. The formed composite is removed from support 40. After this, the back side 2*b* of formed optics 2 is planar ground and/or polished. Subsequently, the composite is joined to a converter 1 via the ground-down back side 2*b* of optics 2. Joining the composite with converter 1, here with the front side 1*a* of converter 1, is carried out via a bonding, pressing, sintering, dispensing and/or laminating of converter 1 onto the processed back side 2*b* of optics 2 or of the composite.

Another embodiment of the method according to the invention is described in FIGS. 4.*a* to 4.*d*. A glass plate 20 and a converter 1 or a converter plate 10 are positioned opposite one another in a first step (FIG. 4.*a*). A sintering of glass plate 20 is carried out on converter plate 10 (FIG. 4.*b*). This takes place at a temperature that lies just above the $T_g$ of the glass of glass plate 20. As a result, there is a structuring of the glass plate (FIG. 4.*c*). Structuring is such that recesses 22 or passages 22 are formed in glass plate 20. In this case, individual glass gobs 2 are formed on the top side of converter plate 10, from which are later formed optics 2. Structuring can be conducted by means of RIE ("Reactive Ion Etching") and/or sandblasting and/or wet etching and/or ultrasonic machining and/or sawing. Structuring is preferably conducted via a lithography method. For structuring, in particular, by means of RIE, in general, a type of mask is applied onto top side 20*a* of glass plate 20, which is then removed again after the structuring, which is not shown, however, in the present figures. After the structuring, a melting of glass section 2 is conducted (FIG. 4.*d*). In the defined melting of the glass, in turn, a so-called semi-spherical lens is formed as optics 2. The glass is fused in a temperature range from approximately 100 to 140° C., preferably of approximately 120° C., above the $T_g$ of the glass. In this case, a temperature of 625° C. results for glass T-SK57. The duration of melting lies in a range of approximately 15 min to approximately 25 min, preferably of approximately 20 min. Optical converter systems 100 are separated, for example, by means of cutting or lapping. If a correspondingly large component is necessary, it can also be used directly.

FIGS. 5.*a* to 5.*d* show a variant of the process, in which a glass plate 20 is structured. In this case, a support 40 is provided, in which recesses 41 are introduced and in which the converter plates 1 or converter 1 can be positioned (FIG. 5.*a*). A sintering of glass plate 20 on converter 1 and preferably also on support 40 (FIG. 5.*b*), a structuring of glass plate 20 (FIG. 5.*c*), and a melting of glass gobs 2 formed by the structuring (FIG. 5.*d*) are all carried out (FIG. 5.*d*). For further details, reference is made to the embodiments relating to FIGS. 4.*a* to 4.*d*. Optics 2 are formed here, however, in a defined manner, since a type of barrier 50 is formed for the collapsing of glass gobs 2 by means of the edges of converter 1 or of recesses 41.

FIGS. 6.*a* to 6.*d* show the next embodiment of the method according to the invention. First, a converter plate 10 is provided (FIG. 6.*a*). Converter plate 10 is equipped with a fixation 50 or a barrier 50 and glass gobs 2 (FIG. 6.*b* or FIG. 6.*c*). Glass gobs 2 can be provided, e.g. as glass beads 2. A barrier for the melting of glass blanks 2 is defined by means of barrier 50. Barrier 50 is preferably formed from graphite. The melting is shown in FIG. 6.*d*. The melting occurs analogously to the melting shown in FIG. 5.*d*.

FIGS. 7.*a* to 7.*d* show a modification of the method presented in FIGS. 6.*a* to 6.*d*. In this case, barrier 50 or limit 50 is formed or defined for the melting by means of a structuring 15 of the top side 10*a* of converter 1 or of converter plate 10. In this case, barrier 50 or structuring 50 can be provided by a subtractive structure 15, such as a recess 15, or by an additive structure, such as an applied layer 15, or by a combination of the two. Structuring 50 is presently formed, for example, as recess 15 or opening 15 in top side 10*a* of converter plate 10. The structuring is produced, for example, via sintering, RIE, sawing and/or a coating/lithography process. A barrier 50 can also be produced by a combination of providing a barrier 50 and by structuring, preferably, top side 1*a* of converter 1.

Another embodiment of the method according to the invention is illustrated in FIGS. 8.*a* to 8.*h*. First, a mold 60, preferably a graphite mold, is provided (FIG. 8.*a*). A plurality of recesses 61 is introduced into one side of mold 60. The mold and the dimensions of the individual recesses 61 or openings 61 are matched to the optical converter system 100 to be formed. Recesses 61 represent a negative mold for the optical converter system 100 to be formed, here, optics 2 to be formed. In order to produce a desired lens effect, the lens shape is adjusted via the geometry of graphite molds 61 or openings 61. Optics 2 are provided via a so-called blank pressing process. Mold 60 is furnished with glass gobs 2 in its openings 61 (FIG. 8.*b*). By means of a second top mold 70, preferably formed as a graphite mold, glass gob 2 is now blank-pressed between the bottom mold 60 and the top mold 70 (FIGS. 8.*c* and 8.*d*). This takes place at a temperature that preferably lies in a range from approximately 50 to approximately 90° C. above the $T_g$ of the glass.

The providing of converter 1 or of converters 1 is described in FIGS. 8.*e* to 8.*g* First, a mold 80 is provided. Corresponding openings 81 are introduced in the top side of mold 80. Openings 81 are adapted to the mold and the dimensions of the optical converter system 100 or of converter 1 to be formed. Openings 81 represent a negative mold of the optical converter system 100, particularly of converter 1 to be formed. A type of channel 82 is optionally introduced in the top side of the respective opening 81. Converters 1 are positioned by this channel 82. Converters 1 preferably possess a constant thickness due to the color coordinate stability that is to be produced.

Converters 1 are now heated. Heating is conducted at a temperature in a range from approximately 400 to 800° C. Converters 1 collapse, sinking into opening 81 and are essentially matched to the shape of opening 81.

The combining of the two pre-shaped components, optics 2 and converter 1, is illustrated in FIG. 8.*h*. The two components 1 and 2 are joined together via a connection process, such as, e.g., sol-gel bonding and/or diffusion bonding.

A variant of the above-described sagging and sinking process is shown in FIGS. 9.*a* to 9.*c*. First, converter plates 1 in a shape (FIG. 9.*a*) as has already been illustrated in FIGS. 8.*e* to 8.*g* are provided and heated. After converters 1 are shaped or formed, now optics 2, preferably lenses 2, are applied via a reflow process. This is illustrated in FIGS. 9.*b* and 9.*c*. First, glass gobs 2, presently formed as small beads, are provided in openings 81. A joining of the individual converters 1 and the respective glass gobs 2 is conducted by heating and melting glass gobs 2. Lens 2 or optics 2 is formed or shaped simultaneously.

FIGS. 10.*a* to 10.*d* show another variant of the method according to the invention. In this case, the optical converter system 100 is produced via a blank pressing process. For this purpose, both glass gobs 2 and converter 1 are each provided in an opening 61 of mold 60. The forming of optical converter system 100 or the forming of the configuration of optical converter system 100 is produced here by combining mold 60 with mold 70. In order to additionally introduce a DOE structure 23 or a micro-optics structure 23 in optics 2, in detail to introduce it in the top side 2*a* of optics 2, corresponding structures 62 are introduced or disposed in the bottom of openings 61. The zigzag shape that is shown illustrates the corresponding structure. Structures 62 represent a negative mold of the structures 23 to be formed on the top side 2*a* of optics 2. Thus, a hot press is again equipped with a press mold 60 and 70, converter substrate 1 and glass gob 2 made of a glass with low $T_g$. Structures 62 are impressed, as it were, in the glass or in optics 2. The following method parameters result for a glass P-SK57: A pressing takes place at a temperature of 530 to 590° C., preferably approximately 560° C., at approximately 10 to 50 kg/cm², particularly for a time of approximately 1 to 3 min.

Of course, optical converter systems 100 produced with the above-described method may or may not be equipped with a metal ring 3, even if this is not shown in detail in the individual figures. If a metal ring 3 is used, the metal ring 3, of course, can also be metallized. For this purpose, FIGS. 11.*a* to 11.*d* illustrate once more the method that is described in FIGS. 10.*a* to 10.*d*, with the use of metal rings 3. Metal rings 3 are provided, for example, by the mold 70. They can also be positioned in the spaces formed.

FIGS. 12.*a* to 12.*d* illustrate the use of the optical converter systems 100 according to the invention in a package 200 or housing 200. A total system 300 or an LED package 300 is formed. The optical converter system 200 according to the invention serves, so to speak, as a type of cover for the housing 200. The package 200 can be a GTMS package ("Glass To Metal Seal"), Si package, a plastic package, and/or a ceramics package.

FIGS. 12.*a* and 12.*d* illustrate the cross section of a housing 200. In each case, this is a three-layer housing 200. It is composed of or comprises a composite made of a base part 201, a first glass layer 202, two connection parts 203, a second glass layer 204 and a head part 205. An LED 260 is disposed inside housing 200. LED 260 or LED chip 260 is disposed in a mounting region 212. LED 260 is joined to connection parts 203 and 204 via wires 273. The so-called passage region 261 for the radiation or the light that is emitted from LED 260 is found above LED 260. The top side of passage region 261 is closed by the optical converter system 100 according to the invention. The passage region 261 and thus package 200 is preferably hermetically sealed by cover 100. This can be carried out, e.g., via soldering the optical converter system 100 to the head part 205 or the top side 200*a* of housing 200, which is provided from a metal.

For example, LED 260 is a blue-emitting LED and converter 1 is a glass that contains a luminescent coloring substance, such as so-called yellow phosphorus. The short-wave blue light excites the coloring substance to light up. This effect is called photoluminescence. In this way, a long-wave yellow light is emitted. In general, the entire blue light is not converted. In this way, white light results from an additive color mixing of the two spectral colors blue and yellow. The conversion from blue to yellow can take place also by means of a ceramicized glass. In another example, LED 260 is an LED emitting UV light, and converter 1 is a glass that contains several luminescent coloring substances, such as so-called red, green and blue (RGB) phosphorus. The short-wave UV light excites the coloring substance to light up. Red, green and blue light are emitted in this way. Therefore, white light results from an additive color mixing. In order to increase the CRI values, a converter 1 can also be combined with an RGB-LED 260. Optionally, in each case, at least one red LED 260 and/or one green LED 260 can be used additionally, which is not shown, however, in the figures. In this way, the color location can be changed and the light can be finely adjusted.

FIG. 12.*a* shows an embodiment in which the system 100 is "simply" placed on housing 200. The three arrows depicted above LED 260 illustrate the direction of emission of radiation emitted by LED 260. FIG. 12.*b* shows an embodiment in which a concentrator 24 or a so-called "light pipe" 24 is disposed on converter 1 as optics 2. On the one hand, the insides of concentrator 24 act as the reflector. On the other hand, the walls also operate as a type of light guide for the light that is emitted laterally from converter 1. The decoupling efficiency of the entire system 300 can be increased by means of concentrator 24. In addition, a second optics 2, designed as lens 25, is disposed on concentrator 23.

In addition, another optics 21 can be disposed underneath converter 1, preferably directly on the bottom side 1b of converter 1. A bundling of the light coming from LED 260 or from the light radiation coming from LED 260 can be produced via such an optics 21. This is shown in FIG. 12.c.

FIGS. 12.a to 12.c in each case show an application of the present invention, in which system 100 is disposed at a distance from LED 260. FIG. 12.d shows an embodiment, in which converter 1 sits on LED 260 or is positioned adjacent to LED 260. The passage region 261 in this case is filled essentially completely by the converter 1.

The present system 100 is preferably an inorganic system 100. System 100 is composed, preferably at least, of one converter 1 and/or an optics 2 and/or a metal support 3. Metal support 3, as described above, can be formed as a ring 3 or as a cap 3. System 100, among other things, can be used as a package cover or as a package closure. The design of the method is suitable for mass production. This is possible based on prevailing processes, such as melting, sagging, sintering, stamping, etc. The temperature resistance, but also the resistance to temperature changes of an optical converter system 100 according to the invention clearly lies above the temperature resistance of known systems. A temperature resistance of up to approximately 400° C. can be obtained for system 100 without a metal ring 3. With a metal ring 3 and for, e.g., a solder containing Sn, system 100 has a resistance of up to approximately 350° C. Also, the preferred components of the system are resistant or are substantially resistant to UV and to chemicals. If system 100 according to the invention is used as a package cover, it can be fastened onto a package 200 in a way that is sealed against air and/or moisture. Since preferably essentially only inorganic components are used, there is no degassing of components, e.g., in the form of hydrocarbons. Thus, an organic contamination of LED 260 can be essentially avoided. Package 200 can be baked and, in fact, filled with inert gas and sealed.

It is obvious to the person skilled in the art that the described embodiments are to be understood by way of example. The invention is not limited to these embodiments, but can be varied in many ways without leaving the spirit of the invention. Features of individual embodiments and the features named in the general part of the description in each case can be combined among themselves and also with one another.

LIST OF REFERENCE SYMBOLS

1 Converter
1a Top side of the converter
1b Bottom side of the converter
2 Optical component or optics or glass gob or glass section
2a Top side of the optical component
2b Bottom side of the optical component
3 Ring or metal ring or metal support
4 Coating or cladding
5 Means for heat removal
10 Converter plate
10a Top side of the converter plate
10b Bottom side of the converter plate
11 Converter layer
12 Converter layer
13 Converter layer
14 Functional layer or coating
15 Structuring or opening or recess
20 Glass plate
20a Top side of the glass plate
20b Bottom side of the glass plate
21 Optical component or optics
22 Recesses or passages
23 DOE structure or microstructure
24 Concentrator
25 Lens
40 Matrix or array or support
41 Recess
50 Limit or limiter or barrier
60 Lower mold or support
61 Recess or opening
62 Structure
70 Top mold
71 Counterpiece to recess 61
80 Mold or support
81 Recess or opening
82 Channel
100 Converter module or optical converter system
200 Housing or functional element housing
200a Top side of the housing
201 Base part or base or support
202 First glass layer
203 Connection part or conductor strip
204 Second glass layer
205 Head part or reflector
212 Assembly region for the functional element
260 Opto-electronic functional element or LED
261 Passage region
273 Wire or wire bonding
300 Total system or LED package

The invention claimed is:

1. An array comprising a plurality of converter modules for converting radiation associated with respective opto-electronic functional elements, each converter module comprising:
    at least one inorganic converter for the conversion of at least one of radiation emitted from and radiation received by a respective opto-electronic functional element, wherein the at least one inorganic converter comprises an inorganic matrix material in which luminous substances are embedded; and
    at least one optical component comprising an inorganic material, which is placed downstream relative to the converter in an emission direction of the respective opto-electronic functional element, wherein the converter and the optical component are inorganically joined together in a cohesive manner to form an inorganic optical converter system that is essentially free of organic components.

2. The array of claim 1, wherein the converter has a temperature resistance of at least 150° C., and wherein the converter comprises at least one material selected from the group consisting of optical ceramics, glass ceramics, ceramicized glass, and phosphor-in-glass (PiG).

3. The array of claim 1, wherein the converter comprises at least 2 stages, and wherein the converter further comprises at least one of a coating, a barrier structure, and embedded particles.

4. The array of claim 1, wherein the converter and the optical component comprise substantially similar curved portions, and wherein the optical component comprises at least one of a coating, a structuring, and embedded particles.

5. The array of claim 1, wherein the optical component comprises a glass that has a glass transition temperature (Tg) of less than approximately 800° C., and further comprising:
    a second optical component mounted upstream relative to the emission direction of the opto-electronic functional element.

6. The array of claim 1, further comprising:
at least one ring extending over at least a portion of a periphery of each converter module, wherein the ring has a metallic coating, at least in sections.

7. The array of claim 1, further comprising:
at least one device associated with the converter for removing heat.

8. An opto-electronic component, comprising:
a housing;
at least one converter module of an array comprising: at least one inorganic converter for the conversion of at least one of radiation and at least one optical component having an inorganic material, which is placed downstream relative to the converter in an emission direction, wherein the at least one inorganic converter comprises an inorganic matrix material in which luminous substances are embedded, and wherein the converter and the optical component are joined together in a cohesive manner by heating the inorganic converter and the optical component; and
at least one opto-electronic functional element configured for at least one of emitting radiation and receiving radiation disposed in the housing.

9. The opto-electronic component of claim 8, further comprising:
at least one light emitting diode (LED); and
at least one of a monitor photodiode and a thermocouple.

10. A lighting device, comprising:
at least one of a converter module of an array comprising at least one inorganic converter for the conversion of at least one of radiation and at least one optical component comprising an inorganic material, which is placed downstream relative to the converter in an emission direction, wherein the at least one inorganic converter comprises an inorganic matrix material in which luminous substances are embedded, and wherein the converter and the optical component are sintered together in a cohesive manner; and
an opto-electronic component comprising a housing and at least one opto-electronic functional element configured for at least one of emitting radiation and receiving radiation disposed in the housing.

11. A method for producing a plurality of converter modules for converting radiation associated with respective opto-electronic functional elements, comprising:
providing a plurality of converters for converting at least one of radiation emitted from and radiation received by the respective opto-electronic functional elements;
providing a plurality of optical components, wherein the plurality of converters and the plurality of optical components are arranged in an array; and
joining the plurality of converters with respective optical components by heating at least one of the converters and the optical components so that the plurality of converters and the respective optical components will adhere to one another and form a cohesive composite to form an array with a plurality of converter modules.

12. The method of claim 11, wherein the optical components and the converters are provided by melting and sealing, wherein the optical components are provided as glass gobs, which are heated until the glass reaches a viscosity at which the optical components are formed, wherein the converters are provided on the optical components by at least one of a pressing, a dispensing, a sintering, and a flaming, and wherein the converters and the optical components are joined by sintering the converters.

13. The method of claim 11, wherein the converters and the optical components are provided as a molding, wherein at least one of the converters and the optical components are provided as a bulk material, which is positioned in a mold, wherein the at least one of the converters and the optical components are formed by a pressing of the bulk material, and wherein the converters and the optical components are heated until they adhere to one another and form a composite.

14. The method of claim 11, wherein the optical components are provided as glass gobs.

15. The method of claim 14, wherein the glass gobs are placed onto the converters and are joined with the converters, wherein the glass gobs are provided by one of a jetting method and a microstructuring, and wherein the glass gobs are heated until the glass reaches a viscosity at which the optical components are formed.

16. The method of claim 14, wherein at least one limit is provided for the defined melting of the glass gobs, and wherein the at least one limit is provided as a discontinuity in surfaces of the converters, on which the optical components will be introduced.

17. The method of claim 16, wherein the at least one limit will be provided by a structuring of the surfaces of the converters on which optical components will be introduced, wherein the at least one limit is produced by at least one of a material-removing and a material-introducing method, and wherein the at least one limit is provided by the positioning of a template proximate to the converters.

18. The method of claim 11, wherein the converters are positioned above respective molds and are heated until a material of the converters reaches a viscosity at which the converters sink into the respective molds, wherein the optical components are provided as glass gobs, which are positioned together with the converters on the respective molds, wherein the glass gobs are heated until the glass reaches a viscosity at which the optical components are formed, and wherein the glass gobs and the converters are heated until they each reach a viscosity at which the converters and the glass gobs sink into the respective molds and form a composite.

19. The method of claim 11, wherein at least one of the converters and the optical components are produced by pressing, wherein the converters and the optical components are joined by at least one of an organic bonding and an inorganic bonding, and wherein the optical components are formed at least partially by pressing and joining.

20. The method of claim 11, further comprising:
providing at least one ring extending over at least a portion of a periphery of each converter module, wherein the ring has a metallic coating, at least in sections; and
providing at least one device associated with each converter for removing heat, wherein the optical components and the converters are prepared by being at least one of structured, coated, smoothed, and polished, at least in sections.

* * * * *